United States Patent
Srinivasan et al.

(10) Patent No.: US 6,219,748 B1
(45) Date of Patent: Apr. 17, 2001

(54) METHOD AND APPARATUS FOR IMPLEMENTING A LEARN INSTRUCTION IN A CONTENT ADDRESSABLE MEMORY DEVICE

(75) Inventors: Varadarajan Srinivasan, Los Altos Hills; Bindiganavale S. Nataraj, Cupertino; Sandeep Khanna, Santa Clara, all of CA (US)

(73) Assignee: NetLogic Microsystems, Inc., Mountain View, CA (US)

( * ) Notice: Subject to any disclaimer, the term of this patent is extended or adjusted under 35 U.S.C. 154(b) by 0 days.

(21) Appl. No.: 09/076,337

(22) Filed: May 11, 1998

(51) Int. Cl.$^7$ .................................................. G11C 15/00
(52) U.S. Cl. ............................ 711/108; 711/5; 711/104; 711/150; 711/151; 711/152; 365/49
(58) Field of Search ..................................... 711/101, 1–5, 711/104–108, 150–152; 365/49

(56) References Cited

U.S. PATENT DOCUMENTS

| | | | |
|---|---|---|---|
| 3,257,646 | 6/1966 | Roth | 340/172.5 |
| 3,353,159 | 11/1967 | Lee, III | 340/172.5 |
| 3,602,899 | 8/1971 | Lindquist et al. | 340/172.5 |
| 3,675,211 | 7/1972 | Raviv | 340/172.5 |
| 3,685,020 | 8/1972 | Meade | 340/172.5 |
| 3,800,286 | 3/1974 | Brown et al. | 711/207 |
| 3,868,642 | 2/1975 | Sachs | 340/172.5 |
| 4,112,502 | 9/1978 | Scheuneman | 364/900 |
| 4,244,033 | 1/1981 | Hattori | 364/900 |
| 4,472,805 | 9/1984 | Wacyk et al. | 371/51 |

(List continued on next page.)

FOREIGN PATENT DOCUMENTS

| | | |
|---|---|---|
| 0 660 332 | 12/1993 | (EP) . |
| 63-276645 | 11/1988 | (JP) . |
| 08167295 | 6/1996 | (JP) . |

OTHER PUBLICATIONS

Applicant's Admitted Prior Arts. pp. 2–3 of specification.*
PCT International Search Report for PCT Int'l Appln No. PCT/US99/0876, mailed Jul. 23, 1999, 6 pgs.
Masao Akata, "A Scheduling Content–Addressable Memory for ATM Space–Division Switch Control", IEEE International Solid State Circuits Conference, Feb. 1991, New York.
Ghose et al., "Response Pipelined CAM Chips: The First Generation and Beyond", $7^{th}$ International conference on VLSI Design, Jan. 1994, pp. 365–368.
Takeshi Ogura, et al., "A 4–kbit Associative Memory LSI", IEEE Journal of Solid–State Circuits, vol. SC–20, No. 6, Dec. 1985, pp. 1277–1281.
Simon R. Jones, et al., "A 9–kbit Associative Memory for High–Speed Parallel Processing Applications", IEEE Journal of Solid–State Circuits, vol. 23, No. 2, Apr. 1988, pp. 543–548.

(List continued on next page.)

Primary Examiner—Do Hyun Yoo
Assistant Examiner—Than Nguyen
(74) Attorney, Agent, or Firm—Blakely, Sokoloff, Taylor & Zafman

(57) ABSTRACT

A content address memory (CAM) device that implements a "LEARN" instruction. In response to the LEARN instruction, the CAM device compares comparand data with data stored in a CAM array of the CAM device. If a match is not found, the comparand data is written into the CAM array. For one example, the comparand data is written to the next free address of the CAM array. The learn instruction may further cause the CAM device to output the next free address after the comparand data has been written into the CAM array. For one embodiment, the learn instruction may be implemented in a single clock cycle.

39 Claims, 20 Drawing Sheets

U.S. PATENT DOCUMENTS

| | | | |
|---|---|---|---|
| 4,523,301 | 6/1985 | Kadota et al. | 365/49 |
| 4,646,271 | 2/1987 | Uchiyama et al. | 365/49 |
| 4,656,626 | 4/1987 | Yudichak et al. | 370/68 |
| 4,670,858 | 6/1987 | Almy | 365/49 |
| 4,747,080 | 5/1988 | Yamada | 365/200 |
| 4,758,982 | 7/1988 | Price | 364/900 |
| 4,780,845 | 10/1988 | Threewitt | 365/49 |
| 4,785,398 | 11/1988 | Joyce et al. | 364/200 |
| 4,791,606 | 12/1988 | Threewitt | 365/49 |
| 4,813,002 | 3/1989 | Joyce et al. | 365/49 |
| 4,845,668 | 7/1989 | Sano et al. | 365/49 |
| 4,903,234 | 2/1990 | Sakuraba et al. | 365/49 |
| 4,928,260 | 5/1990 | Chuang et al. | 365/49 |
| 4,958,377 | 9/1990 | Takahashi | 382/34 |
| 4,959,811 | 9/1990 | Szczepanek | 365/49 |
| 4,975,876 | 12/1990 | Nakabayashi et al. | 365/49 |
| 4,996,666 | 2/1991 | Duluk, Jr. | 365/49 |
| 5,010,516 | 4/1991 | Oates | 365/49 |
| 5,014,195 | 5/1991 | Farrell et al. | 364/200 |
| 5,036,486 | 7/1991 | Noguchi et al. | 365/49 |
| 5,051,948 | 9/1991 | Watabe et al. | 365/49 |
| 5,053,991 | 10/1991 | Burrows | 365/49 |
| 5,107,501 | 4/1992 | Zorian | 371/213 |
| 5,111,427 | 5/1992 | Kobayashi et al. | 365/49 |
| 5,226,005 | 7/1993 | Lee et al. | 365/49 |
| 5,265,100 | 11/1993 | McClure et al. | 371/21.2 |
| 5,339,268 | 8/1994 | Machida | 365/49 |
| 5,383,146 | 1/1995 | Threewitt | 365/49 |
| 5,414,704 | 5/1995 | Spinney | 370/60 |
| 5,440,709 | 8/1995 | Edgar | 395/401 |
| 5,454,094 | 9/1995 | Montoye | 395/435 |
| 5,455,576 | 10/1995 | Clark, II et al. | 341/50 |
| 5,469,161 | 11/1995 | Bezek | 341/51 |
| 5,485,418 | 1/1996 | Hiraki et al. | 365/49 |
| 5,485,526 | 1/1996 | Tobin | 382/232 |
| 5,490,102 * | 2/1996 | Jubran | 365/49 |
| 5,491,703 | 2/1996 | Barnaby et al. | 371/40.1 |
| 5,513,134 | 4/1996 | Cooperman et al. | 365/49 |
| 5,517,441 | 5/1996 | Dietz et al. | 365/49 |
| 5,649,149 | 7/1997 | Stormon et al. | 711/108 |
| 5,706,224 | 1/1998 | Srinivasan et al. | 365/49 |
| 5,758,148 * | 5/1998 | Lipovski | 711/108 X |
| 5,818,873 | 10/1998 | Wall et al. | 375/240 |
| 5,841,874 | 11/1998 | Kempke et al. | 380/50 |
| 5,860,085 | 1/1999 | Stormon et al. | 711/108 |
| 5,893,931 | 7/1999 | Peng et al. | 711/206 |
| 5,905,668 * | 5/1999 | Takahashi et al. | 365/49 |
| 5,940,852 | 8/1999 | Rangasayee et al. | 711/108 |

OTHER PUBLICATIONS

Anthony J. McAuley, et al., "A Self–Testing Reconfigurable CAM", IEEE Journal of Solid–State Circuits, vol. 26, No. 3, Mar. 1991, pp. 257–261.

Yong–Chul Shin, et al., "A Special–Purpose Content Addressable Memory Chip for Real–Time Image Processing", IEEE Journal of Solid–State Circuits, vol. 27, No. 5, May 1992, pp. 737–744.

KLSI, "Address Processor" KE5B064H series –Dual Port and Fixed Table Type–, Version 1.0.1, published approximately late 1995 or early 1996, pp. 1–1 through 14–1.

KLSI, "KE5B064A1 Address Processor" Version 2.0.2, published approximately late 1995 or early 1996, pp. 1–1 through 12–1.

Motorola Semiconductor Technical Data, "Advance Information 16K x 64 CAM" MCM69C432, Jan. 1996, pp. 4 pages total.

Hiroshi Kadota, et al., "An 8–kbit Content–Addressable and Reentrant Memory", IEEE Journal of Solid–State Circuits, vol. SC–20, No. 5, Oct. 1985, pp. 951–956.

Landrock et al., "Associative Storage Module", IBM Technical Disclosure Bulletin, vol. 25, No. 5, Oct. 1982, pp. 2341–2342.

Soo–Ik Chae, et al., "Content–Addressable Memory for VLSI Pattern Inspection", IEEE Journal of Solid–State Circuits, vol. 23, No. 1, Feb. 1988, pp. 74–78.

Sergio R. Ramirez–Chavez, "Encoding Don't Cares in Static and Dynamic Content–Addressable Memories", Transaction Briefs IEEE Transactions on Circuits and System–II: Analog and Digital Signal Processing, vol. 39, No. 8, Aug. 1992, pp. 575–578.

Advanced Micro Devices, "Final Am99C10A 256 x 48 Content Addressable Memory" Publication No. 08125, Rev. G, Dec. 1992, pp. 1–21.

Music Semiconductors, "MU9C1480 LANCAM" Advance Information, Mar. 22, 1990, pp. 1–11.

Music Semiconductor, The MU9C1480 LANCAM Handbook, Rev. 3, Nov. 1994, pp. 1–1 through 7–12.

Music Semiconductors, "MU9C1480 LANCAM™" Preliminary Specification, Jan. 15, 1991, Rev O, pp. 1 page total.

Music Semiconductors, "MU9C2480 LANCAM Preliminary Data Sheet", Aug. 25, 1995, pp. 1–24.

Music Semiconductors, "MUAA™ CAM Family" Advance Information, Feb. 24, 1988, Rev. O, pp. 1–16.

GEC Plessey Semiconductors Preliminary Information, "P2800 2K x 64 Bit Multi–Port Content Addressable Memory", Feb. 1997, pp. 1–15.

GEC Plessey Semiconductors, "P2800 Multi–port Content Addressable Memory Functional Product Specification GPS–FPS–2800–12", Jan. 1996, pp. 1–102.

Ian N. Robinson, Hewlett–Packard Laboratories, "Pattern–Addressable Memory", Jun. 1992, pp. 20–30.

Keikichi Tamaru, "The Trend of Functional Memory Development", Invited Paper Special Issue on LSI Memories, IEICE Trans. Electron., vol. E76–C, No. 11, Nov. 1993, pp. 1545–1554.

U.S. Patent Application No. 08/967,314, entitled "Synchronous Content Addressable Memory with Single Cycle Operation", filed on Oct. 30, 1997, pp. 47 total.

U.S. Patent Application No. 09/001,110, entitled "Method and Apparatus for Cascading Content Addressable Memory Devices", filed on Dec. 30, 1997, pp. 36 total.

U.S. Patent Application No. 09/076,336, entitled "Method and Apparatus for Implementing a Learn Instruction in a Depth Cascaded Content Addressable Memory System", filed on May 11, 1998, pp. 64 total.

U.S. Patent Application No. 09/111,364, entitled "Method and Apparatus for Performing a Read Next Highest Priority Match Instruction in a Content Addressable Memory Device" filed on Jul. 6, 1998, pp. 58 total.

* cited by examiner

US 6,219,748 B1

METHOD AND APPARATUS FOR IMPLEMENTING A LEARN INSTRUCTION IN A CONTENT ADDRESSABLE MEMORY DEVICE

FIELD OF THE INVENTION

The present invention relates generally to content addressable memory (CAM) devices.

BACKGROUND

A content addressable memory (CAM) device is a storage device that can be instructed to compare a specific pattern of comparand data with data stored in its associative CAM array. The entire CAM array, or segments thereof, are searched in parallel for a match with the comparand data. If a match exists, the CAM device indicates the match by asserting a match flag. If no matching entries are found, the CAM device can be subsequently instructed to write the comparand data into the next available empty memory location in the CAM array. The next free location is commonly referred to as the next free address or "NFA".

A typical process of comparing comparand data with a CAM array and updating the CAM array with non-repetitive data (i.e., data not already stored in the CAM array) generally requires multiple instructions and multiple clock cycles. A typical process includes the following steps: (1) a first instruction and clock cycle to write comparand data into the CAM device and instruct the CAM device to perform a comparison operation; (2) a second clock cycle for external logic to determine if the match flag has been asserted and decide how to proceed; (3) a second instruction and third clock cycle to instruct the CAM device to load the comparand data into the next free address from the comparand register; and, (4) a third instruction and fourth clock cycle to instruct the CAM device to output the next free address that received the comparand data, and which may be required by other external memories that may store associated data or other information for this memory location.

Because of the multiple number of instructions and clock cycles required to update a CAM device with non-repetitive data, the overall operating speed of the CAM device is reduced. Additionally, the maximum search rate of the CAM device cannot be maintained as it generally requires at least one clock cycle for external logic to determine whether a match occurred in the search.

Thus, it would be desirable to have a CAM device that can update the CAM array with non-repetitive data in fewer instructions and fewer clock cycles. It would also be desirable to have a CAM device that may sustain its maximum search rate during the operation. Such a CAM device may be loaded with non-repetitive data at faster rates than is conventionally possible.

SUMMARY OF THE INVENTION

A content address memory (CAM) device is disclosed that implements a "LEARN" instruction. In response to the LEARN instruction, the CAM device compares comparand data with data stored in a CAM array of the CAM device. If a match is not found, the comparand data is written into the CAM array. For one example, the comparand data is written to the next free address of the CAM array. The LEARN instruction may further cause the CAM device to output the next free address after the comparand data has been written into the CAM array. For one embodiment, the learn instruction may be implemented in a single clock cycle.

Other objects, features, and advantages of the present invention will be apparent from the accompanying drawings and from the detailed description which follows below.

BRIEF DESCRIPTION OF THE DRAWINGS

The features and advantages of the present invention are illustrated by way of example and are by no means intended to limit the scope of the present invention to the particular embodiments shown, and in which.

DETAILED DESCRIPTION

Figure 1:
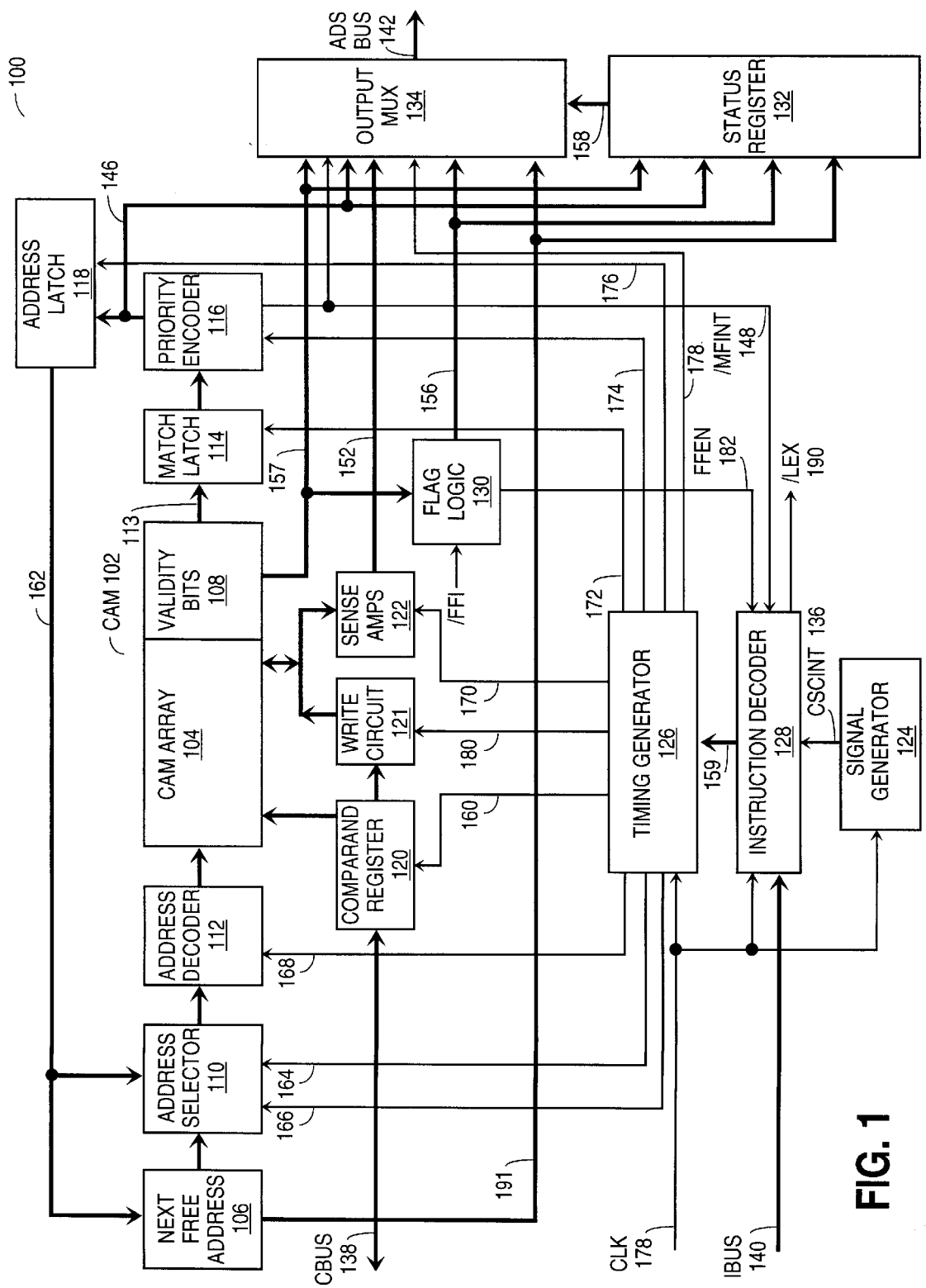
FIG. 1 is a block diagram of one embodiment of a CAM device according to the present invention.

A content addressable memory (CAM) device is disclosed. In the following description, for purposes of explanation, specific nomenclature is set forth to provide a thorough understanding of the present invention. However, it will be apparent to one skilled in the art that these specific details may not be required to practice the present invention. In other instances, well known circuits and devices are shown in block diagram form to avoid obscuring the present invention unnecessarily. Additionally, the interconnection between circuit elements or blocks may be shown as buses or as single signal lines. Each of the buses may alternatively be single signal lines, and each of the single signal lines may alternatively be buses. Additionally, the prefix symbol "/" or the suffix "B" attached to signal names indicate that the signal is an active low signal. Each of the active low signals may be changed to active high signals as generally known in the art.

The CAM device of the present invention implements a new instruction called a "LEARN" instruction that enables the CAM device to load CAM data that is not already stored in the CAM device. Upon receiving a LEARN instruction, the CAM compares comparand data with data stored in a CAM array in the CAM device. If a match is found, the CAM device may proceed with a typical compare operation and output, in the same or later clock cycles, the matching address, status information including validity bits and flag information, and/or data stored in one or more CAM cells of the CAM array at the matching address. Alternatively, the CAM device may simply assert a match flag and end the operation. If a match is not found, the comparand data may then be written into the CAM array. For one embodiment, the data may be written into the next free address of the CAM array. The LEARN instruction may further cause the CAM device to output the next free address after the comparand data has been written into the CAM array. Thus, other circuitry or logic communicating with the CAM device may know which address in the CAM array received the comparand data.

The single LEARN instruction may be implemented in fewer clock cycles than required by conventional schemes of updating data in CAM devices. For one embodiment, the LEARN instruction may be implemented in a single clock cycle. The single clock cycle may have any cycle time. For one embodiment, the single cycle time may be approximately 25 ns and the CAM device may have a search rate of approximately 40 million searches per second. Thus, the present invention may be very useful in a high-speed (e.g., 100 Mb/s or 1 Gb/s) network bridge or router environment. For example, the CAM device of the present invention may support eight or more ports, segments, or devices in a high-speed ethernet switch or router environment having, for example, a data rate of 1 Gb/s. The CAM device of the present invention may store destination addresses of data packets sent between the segments, ports, or devices in the network. For other embodiments, the single LEARN instruction may be implemented in more than one clock cycle.

FIG. 1 shows CAM device 100 that is one embodiment of a CAM device that may implement the LEARN instruction of the present invention. CAM 100 is a synchronous CAM device that performs its operations in response to an external clock signal CLK 178. It will be appreciated, however, that alternative embodiments of the present invention may be implemented in asynchronous CAM devices.

CAM device 100 may include an instruction bus IBUS 140 for receiving instructions, a separate comparand bus CBUS 138 for receiving comparand data to be compared with one or more CAM cells of CAM array 104, and a separate data bus ADS BUS 142. For an alternative embodiment, one or more of buses 138, 140, and 142 may be shared or time multiplexed. ADS BUS 142 may simultaneously or individually output: a match address or CAM index for a location of CAM array 104 that matches the comparand data; data stored in one or more of the CAM cells of the CAM array, wherein the data may be associated with the matched address; status information corresponding to the matched address or associated data; and/or the next free address stored in next free address register 106. The status information may include a match flag, multiple match flag, full flag, skip bit, empty bit, and/or other identification for CAM device 100. ADS BUS 142 may be any size to accommodate any number of bits. For one embodiment, ADS BUS 142 is a 64-bit bus. ADS BUS 142 may be buffered or registered.

CBUS 138 may be a bi-directional bus used to provide comparand data to comparand register 120 or directly to CAM array 104 of CAM 102. CBUS 138 may also be coupled to status register 132, CAM 102, and one or more mask registers (not shown). CBUS 138 may be any size to accommodate any number of bits of comparand data. For one embodiment, CBUS 138 is a 64-bit bus. CBUS 138 may be buffered or registered.

IBUS 140 is used to provide instructions to instruction decoder 128. Instructions may be clocked into instruction decoder 128 from IBUS 140 by external clock signal CLK 178 or by one or more clock signals output from a clock buffer (not shown) that may generate clock signals having varying phases and frequencies. IBUS 140 may be any size to accommodate any number of bits and any number of instructions. For one embodiment, IBUS 140 is 14 bits wide to accommodate $2^{14}$ unique possible binary coded instructions. Other encodings may be used. IBUS 140 may be buffered or registered. Instruction decoder 128 decodes the instructions on IBUS 140 and provides one or more control signals to timing generator 126 over signal line(s) 159. Timing generator 126 may then output the appropriate control signals to the various circuits to implement the LEARN instruction.

Output multiplexer 134 provides data to ADS BUS 142. Output multiplexer 134 may include output buffers, one or more multiplexers, a selector circuit, registers, or latches. Output multiplexer 134 may receive a matching CAM address or index from priority encoder 116 via bus 146, and may also receive data stored in CAM array 104 via sense amplifiers 122 and bus 152. Additionally, output multiplexer 134 may receive status information including a match flag signal (/MFINT) from priority encoder 116 via line 148, a full flag signal (FFINT) from flag logic 130 via line(s) 156, and/or validity bits 108 via bus 157. Output multiplexer 134 may additionally receive a next free address from next free address register 106. The next free address corresponds to the next available address that may be written to in CAM array 104. The next available address corresponds to, for example, the next empty address in CAM array 104. Output multiplexer 134 may alternatively receive all or some of the above-described data from status register 132 via bus 158. Status register 132 may comprise one or more registers.

CAM device 100 may also include flag logic 130 that may generate FFINT signal on line(s) 156 in response to validity bits 108 on bus 157. The full flag indicates whether CAM array 104 is full or has more locations that can accept data. Flag logic 130 may also generate a match flag signal and multiple match flag signal on line(s) 156. The flags may be coupled to output multiplexer 134 and/or status register 132. Flag logic 130 may also provide a full flag enable signal FFEN on line 182 to instruction decoder 128. FFEN may be asserted when FFINT indicates that CAM 100 is not full and the input pin /FFI to CAM 100 is asserted to a low state. /FFI may be coupled to an external pin and may be asserted to a low state in a single-device implementation, or when CAM 100 is the first device (e.g., highest or lowest priority device) in a depth cascade configuration. Additionally, /FFI may be asserted to a low state by a full flag output pin of a previous higher or lower priority CAM devices in a depth cascade configuration (as described in more detail below). For one embodiment, flag logic 130 may include a NOR gate that has one input coupled to the internal full flag FFINT, and the other input coupled to input pin /FFI. Other embodiments may be used. For another embodiment, the full flag signal on lines 156 and 182 may be the same signal.

CAM device 100 also includes CAM 102. CAM 102 includes a CAM array 104 that may be organized in any number of rows and columns of CAM cells. CAM 102 may also include validity bits 108 that store information about corresponding locations in CAM array 104. For example, the validity bits for a given row or location in CAM array 104 may include a skip bit and an empty bit. The validity bits may indicate that a particular location in CAM array 104 should be skipped when performing a compare operation with comparand data stored in comparand register 120. The validity bits may also indicate that a corresponding location in CAM array 104 is empty. The validity bits also group the CAM cells into four states as indicated in Table 1. A comparison operation may compare comparand data against any of the locations in CAM array 104 that correspond to a given state.

TABLE 1

| SKIP | EMPTY | STATE |
| --- | --- | --- |
| 0 | 0 | VALID |
| 0 | 1 | EMPTY |
| 1 | 0 | SKIP |
| 1 | 1 | RAM |

Validity bits 108 may be provided (e.g., through sense amplifiers 122) to output multiplexer 134, status register 132, and/or flag logic 130 via bus 157. Alternatively, validity bits 108 may be generated or decoded in response to a decoded instruction output by instruction decoder 128.

CAM 102 outputs match information on a plurality of match lines 113 to match latch 114. Match latch 114 latches the match data on the match lines in response to a signal on line 172, and provides the match information to priority encoder 116. Priority encoder 116 may determine the highest priority match address and may also generate internal match flag signal /MFINT on line 148. Priority encoder 116 may also generate the highest priority empty address or next free address during a write instruction by monitoring the status of the validity bits as generally known in the art.

Figure 2:
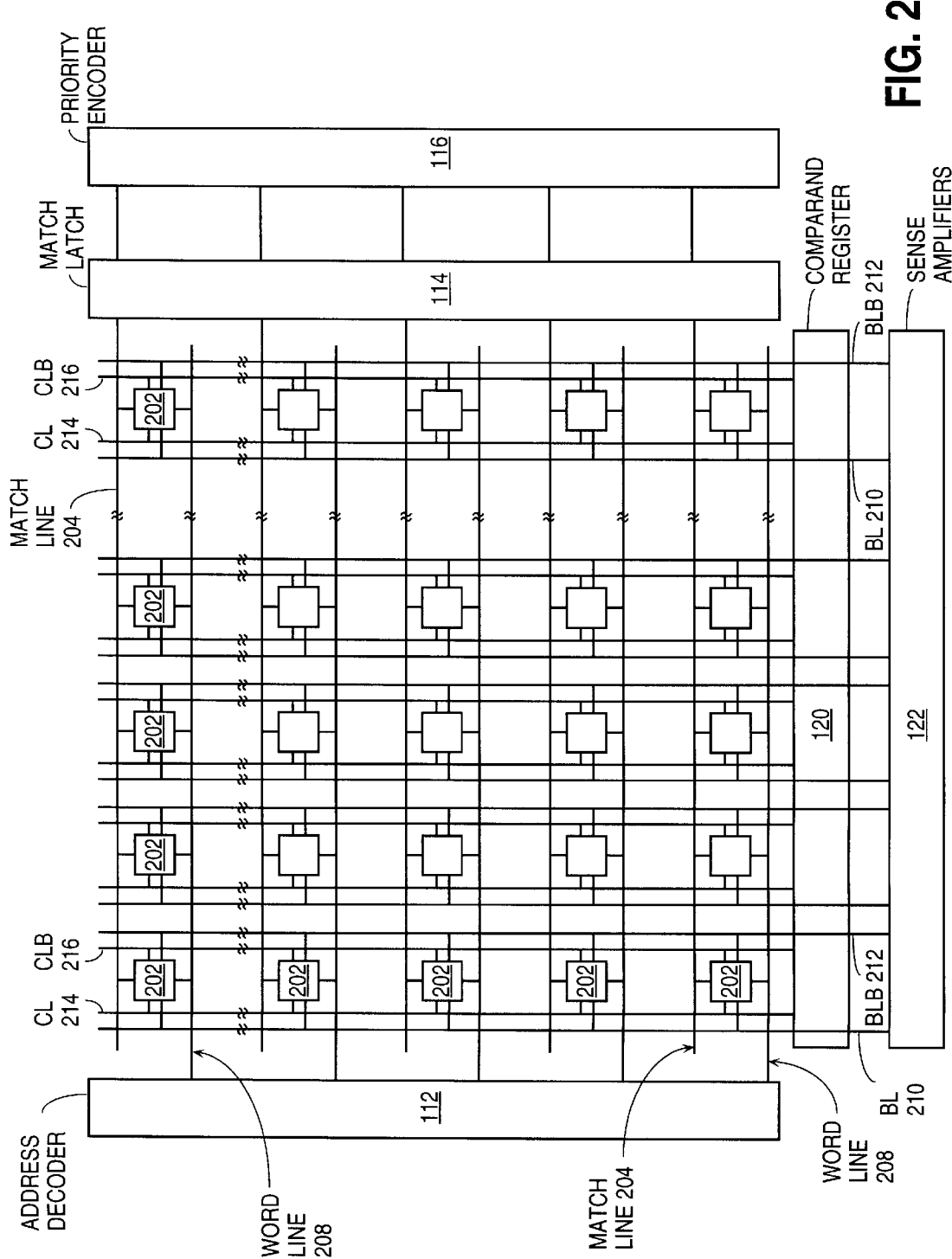
FIG. 2 is block diagram of one embodiment of the CAM array of FIG. 1.

FIG. 2 shows one embodiment of CAM array 104 having a plurality of CAM cells 202 organized in any number of rows and columns. For one embodiment, CAM array 104 may include approximately 4 k (i.e., 4096) rows of CAM cells 202 and approximately 64 columns of CAM cells 202. For another embodiment, CAM array 104 may include approximately 4 k rows of CAM cells 202 and approximately 128 columns of CAM cells 202. The validity bits may also be included in additional rows and columns of CAM cells.

Each row of CAM cells is coupled to a match line 204 and a word line 208. Each word line 208 is driven by address decoder 112 to select one or more of CAM cells 202 for writing or reading. Each match line 204 is coupled to match latch 114 that latches the match results of a comparison operation. An individual match line will indicate a match only if all of the CAM cells 202 (actually compared) in that row match the comparand data. The latch results are then provided to priority encoder 116 which generates an address corresponding to at least one of the matched addresses. For one embodiment, the matched address is the highest priority match address. The highest priority match address may be the lowest numbered matching address, the highest numbered matching address, or any other selected matching address. Alternatively, the match address may be the lowest priority match address, or any other predetermined priority.

Each column of CAM cells is coupled to a bit line (BL) 210, a complementary bit line (BLB) 212, a compare line (CL) 214, and a complementary compare line (CLB) 216. BL 210 and BLB 212 are coupled to sense amplifiers 122 that may enable data to be read from or written to CAM cells 202. CL 214 and CLB 216 are coupled to comparand register 120 and provide comparand data to CAM cells 202 for comparison purposes. For alternative embodiments, other CAM array architectures may be used. For example, CAM array 104 may not include CL 214 and CLB 216; rather, BL 210 and BLB 212 may be coupled to comparand register 120 and may be used to perform a comparison with data stored in CAM cells 202 as generally known in the art. For example, in the first part of a compare cycle time, compare data may be provided onto BL 210 and BLB 212 from comparand register 120. In the second part of the compare cycle time, BL 210 and BLB 212 may be driven with data to be output from CAM array 104.

Figure 3:
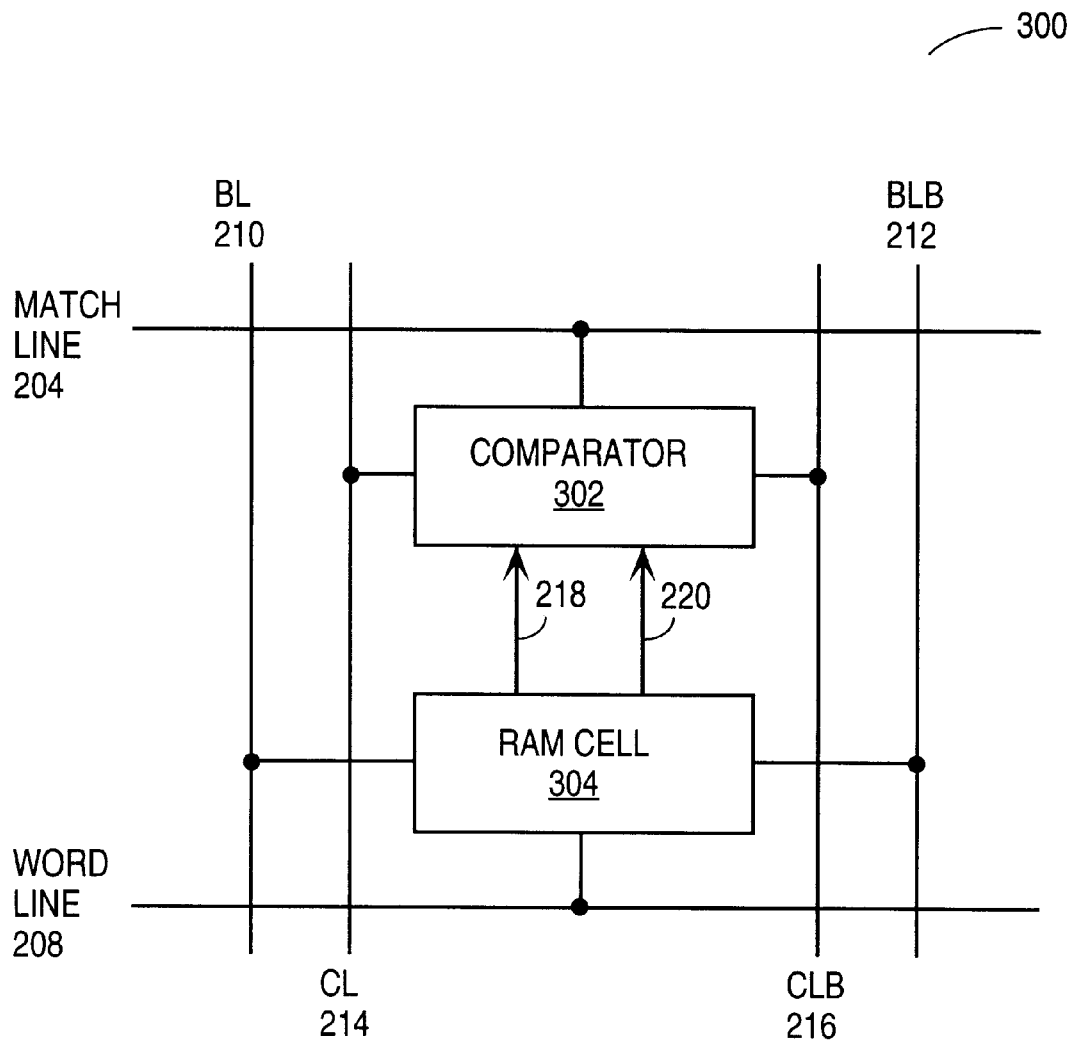
FIG. 3 is a block diagram of one embodiment of a CAM cell.

FIG. 3 shows CAM cell 300 that is one embodiment of a CAM cell 202. CAM cell 300 includes comparator 302 and RAM cell 304. RAM cell 304 is coupled to BL 210, BLB 212, and word line 208, and may be any type of RAM cell. When RAM cell 304 is selected by word line 208, data may be read from or written to RAM cell 304 via bit lines BLB 210 and BLB 212. Comparator 302 is coupled to RAM cell 304, CL 214, CLB 216, and match line 204. Comparator 302 may compare data from comparand register 120 (supplied on CL 214 and CLB 216) with data stored in RAM cell 304 (supplied on lines 218 and 220), and output the comparison result to match line 204. Comparator 302 may be any type of comparison circuit including an exclusive OR (XOR) or exclusive NOR (XNOR) gate. The comparison and write or read function of CAM cell 300 may be performed simultaneously or sequentially. In alternative embodiments (e.g., CL 214 and CLB 216 omitted), the comparison and read or write function may be performed sequentially. Because of the separate bit lines and compare lines, CAM cell 300 may perform a comparison operation at the same time that data is read from RAM cell 304. This may be advantageous in performing compare operations in CAM devices such as CAM device 100 of FIG. 1.

With respect to FIG. 2, CAM array 104 may store associative memory data or compare data (e.g., port address, pattern recognition keys, etc.) in any number of CAM cells 202 of a given row of CAM cells. The compare data may be compared with comparand data stored in comparand register 120. Similarly, CAM array 104 may store associated data or RAM data (e.g., bridge or switch port address, access information, or aging data) in any number of CAM cells 202 of a given row of CAM cells. The associated data may correspond to, or be associated with, other CAM cells in the same row that store compare data. The CAM cells 202 may be partitioned with a granularity of one into compare data and associated data segments. The compare data and associated data segments may be interleaved, or they may be non-interleaved segments. For one embodiment, a memory configuration register (not shown) may be used to program which bits in CAM array 104 are used to store compare data, and which bits are used to store associated data.

The associated data may be output from CAM array 104 (e.g., via sense amplifiers 122 and output multiplexer 134) in any order or in any format. For one embodiment, CAM array 104 may output its contents in multi-bit segments. Each segment may store compare data, associated data, or other information. For one example, CAM array 104 may be partitioned into four segments of 16 bits each. One or more of the segments may be sensed and output by output multiplexer 134 in any order (e.g., 24 or 16 possible ordered outputs).

Figure 4:
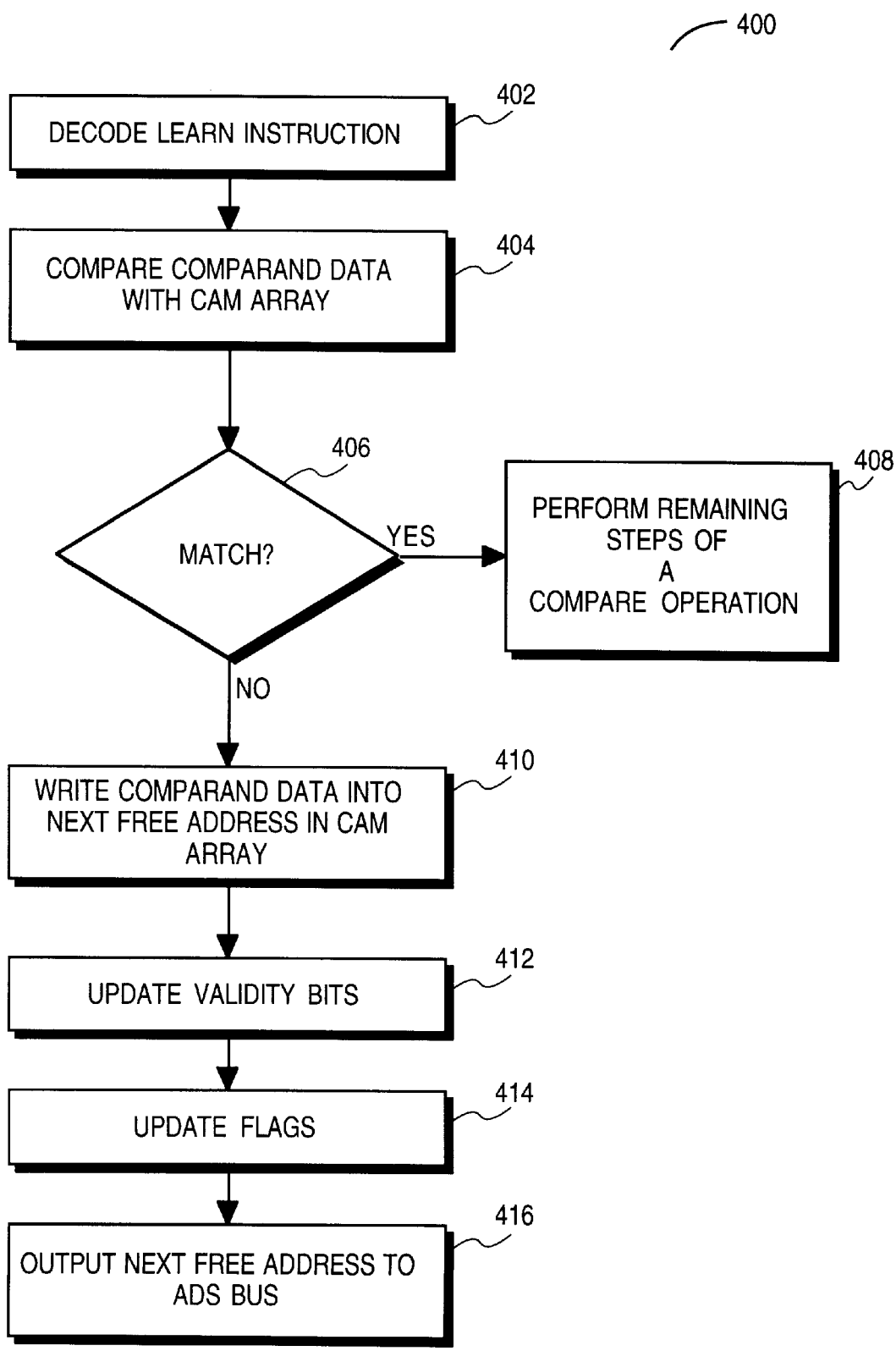
FIG. 4 is one embodiment of a method of performing a learn instruction.

FIG. 4 describes one embodiment 400 of generally performing a LEARN instruction in CAM device 100. The process may be used to perform the LEARN operation in one clock cycle, or in multiple clock cycles. At step 402, instruction decoder 128 decodes a LEARN instruction provided on IBUS 140. Instruction decoder 128 may include a look-up table, a state machine, or any other control logic that can decode the LEARN instruction on IBUS 140. In response to the LEARN instruction, comparand register 120 may load comparand data from CBUS 138. Alternatively, the comparand data may not be loaded into comparand register 120, but may remain on CBUS 138 for step 404.

At step 404, the comparand data is compared with data stored in CAM array 104 to determine if there is a match. One or more bits of the comparand data may be masked by mask registers (not shown) coupled to CAM array 104. The LEARN instruction may be binary encoded on IBUS 140, or may be encoded in any other format. The comparison results of the step 404 will be reflected by the state of match lines 113.

At step 406, priority encoder 116 or other match logic determines if there is a match and sets internal match flag /MFINT to the appropriate logic state. If there is a match, then the remaining steps of a compare instruction may be performed at step 408. The remaining steps of the compare instruction may cause CAM device 100 to output (1) the match address of the highest priority match location in CAM array 104, (2) data stored in one or more CAM cells of CAM array 104 at the highest priority match address, wherein the CAM cells may store data associated with the matched address, and/or (3) status information including flags and one or more of the corresponding validity bits for the match location. This information may be output from CAM device 100 in the same clock cycle that the LEARN instruction was received by CAM device 100, or it may be output in later clock cycles.

If it is determined that there is no match, then the comparand data may be loaded into the next free address in CAM array 104 at step 410. The next free address may be that address that currently does not contain any valid data and has the next highest (or lowest) priority empty address in CAM array 104. The next free address may be stored in next free address register 106. Mechanisms for determining the next free address are well-known. One mechanism includes providing the validity bits to priority encoder 116 during a write operation. Priority encoder 116 may then determine the highest priority empty address and stores this address into the next free address register 106 via bus 162. An alternative mechanism uses a separate priority encoder to decode the highest (or lowest) priority empty address from the validity bits.

For other embodiments, a different address other than the next free address may be selected at step 410 including the highest priority match address, or any other selected address in CAM array 104.

After the comparand data has been written into CAM array 104, the CAM device may update the validity bits for the newly written location at step 412. At step 414, CAM device may also update the status of the flags, including updating the full flag to indicate if CAM array 104 is full. Additionally and/or alternatively, an internal or external flag /LEX (on line 190) may be asserted during the LEARN instruction. For one embodiment, the flag is asserted when the LEARN instruction executes step 410 and writes comparand data into the next free address of CAM array 104. If step 410 is not executed, or if the LEARN instruction is not presented to CAM 100 on IBUS 140, /LEX may then be deasserted or placed into a high impedance state. For one embodiment, /LEX may be provided on line 159. For another embodiment, /LEX may be a signal on line 159 that is latched (in response to clock signal such as CLK 178 or a derivative thereof) and buffered before being output by CAM 100. /LEX may also be stored in a register. For one embodiment, /LEX may be stored in status register 132.

At step 416, CAM device 100 may optionally output the next free address that was just written into as a result of the LEARN instruction. The next free address may be provided to ADS BUS 142 via bus 191 and output multiplexer 134. Each of steps 412, 414, and 416 may also be completed within the same clock cycle as steps 402–406, or they may be completed in later clock cycles.

In an alternative embodiment, step 410 may be performed before step 404. For example, after receiving the LEARN instruction, CAM device 100 may load the comparand data into the next free address of CAM array 104. The validity bits may not be updated until after step 404 such that the newly loaded data does not participate in the search of CAM array 104 at step 404. If there is a match determined at step 406, then the validity bits will not be updated and subsequently the next free address will not be updated. If there is no match at step 406, then steps 412–416 may be performed. This embodiment may allow the internal full flag signal to be generated earlier in time than the process shown in FIG. 4.

Figure 5:
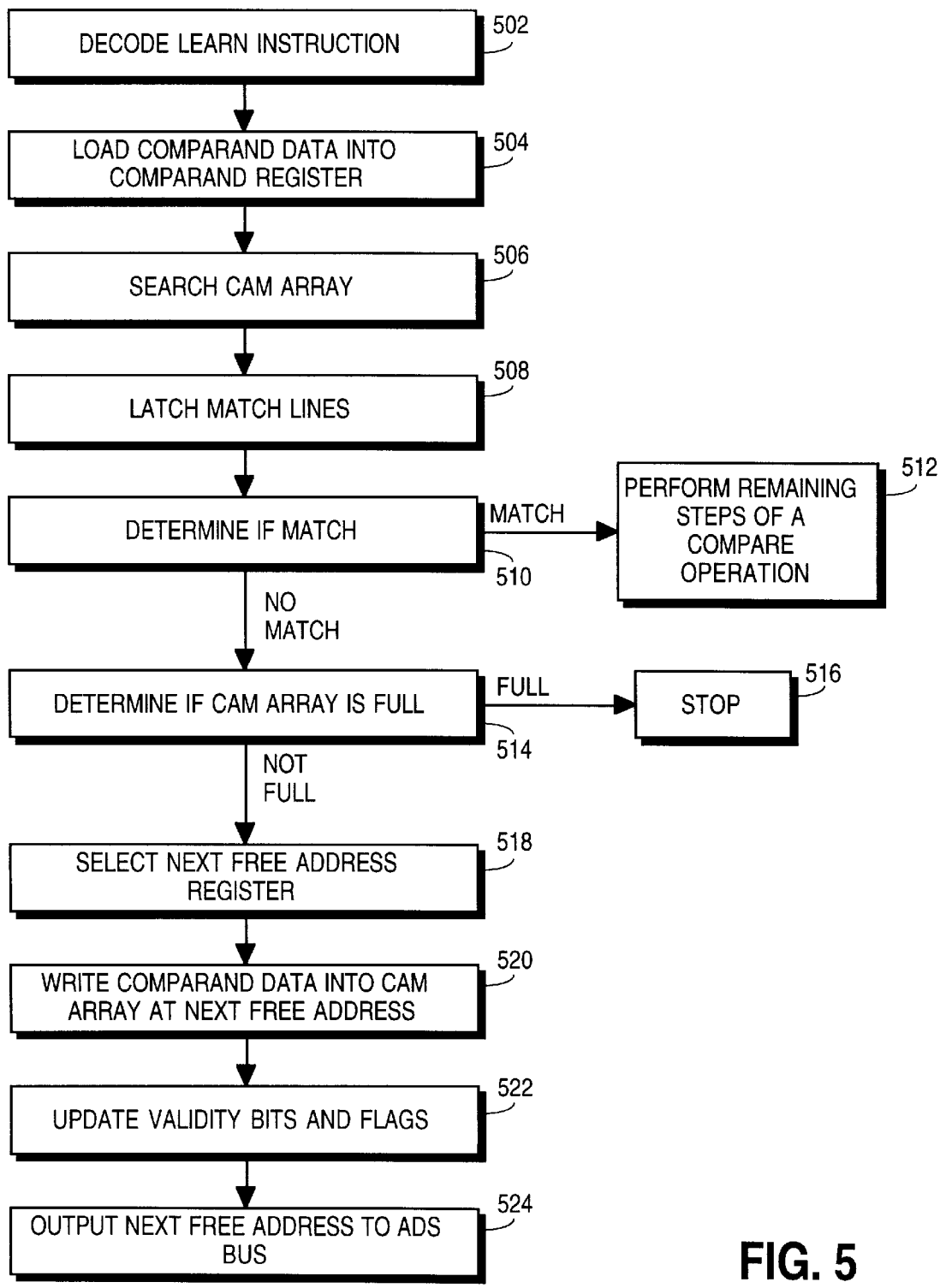
FIG. 5 is a more detailed embodiment of the method of performing a learn instruction of FIG. 4.

FIG. 5 shows a more detailed flow diagram of implementing the LEARN instruction outlined in FIG. 4. The process will be described with the aid of the illustrative timing diagram shown in FIG. 6. At step 502 and time t0, instruction decoder 128 receives and decodes the LEARN instruction on IBUS 140 in response to the start of a clock cycle of CLK 178. At step 504 and starting at or between times t0 and t1, instruction decoder 128 may send one or more signals (not shown in FIG. 6) on bus 159 indicating that a LEARN instruction has been received by CAM device 100. The signal(s) on bus 159 may be a pulse signal that is asserted or deasserted for any appropriate length of time including until time t11. In response, timing generator 126 may send a signal on line 160 at time t1 such that comparand data on CBUS 138 is loaded into comparand register 120. As previously described, the comparand data may alternatively not be loaded into comparand register 120, but may be directly compared with CAM array 104 from CBUS 138. The comparand data may or may not be masked by mask registers (not shown).

At step 506, the comparand data is compared against one or more CAM cells in CAM array 104. At step 508 and time t3, the match results on match lines 113 are latched by match latch 114 in response to a signal on line 172. The signal on line 172 may be, for example, a self-timed signal or a clock signal (such as CLK 178 or a derivative thereof). The latched match signals are coupled to priority encoder 116. Priority encoder 116 then determines if there is a match, and outputs match flag signal /MFINT on line 148. Priority encoder 116 also determines the highest priority matching address from the match results output by match latch 114. At step 510 and time t4, timing generator 126 generates a signal on line 174 that causes priority encoder 116 to output /MFINT on line 148 and the highest priority match address to bus 146. Alternatively, a signal on line 174 may not be required for priority encoder 116 to output /MFINT and/or the highest priority matching address to bus 146.

Instruction decoder 128 receives /MFINT and determines at step 510 whether there is a match. In order to know when to sample /MFINT, CAM device 100 may include signal generator 124 that may provide a sampling signal CSCINT on line 136. At time t2, signal generator 124 may cause CSCINT on line 136 to transition to a low state for a predetermined amount of time (e.g., t6–t2) to allow CAM 100 to determine the state of /MFINT. Signal generator 124 may transition CSCINT to a high state at time t6 indicating that instruction decoder 128 may sample /MFINT on line 148. For an alternative embodiment, CLK 178 or a clocked delayed from CLK 178 may be used to sample /MFINT. For yet another embodiment, no sampling signal may be required.

Figure 7:
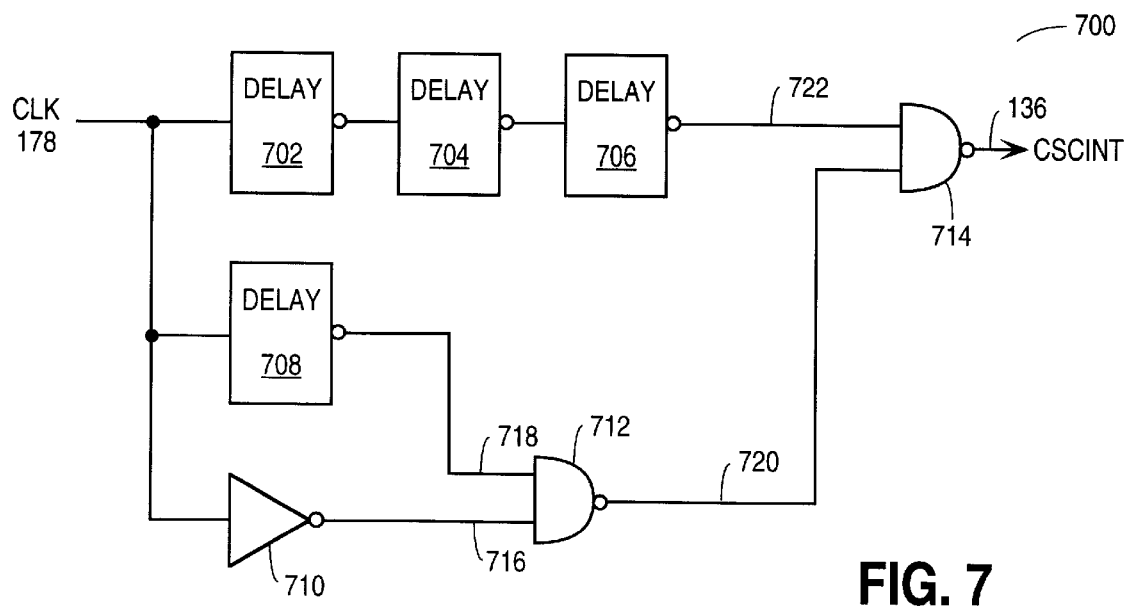
FIG. 7 is a logic diagram of one embodiment of the signal generator of FIG. 1.

Any signal generator may be used that generates CSCINT on line 136 at the appropriate time or for a predetermined period of time sufficient for instruction decoder 128 to sample /MFINT on line 148. One embodiment of signal generator 124 is shown as generator 700 in FIG. 7. Generator 700 is a one-shot circuit that has a first delay path including inverting delay elements 702, 704, and 706 coupled in series between CLK 178 and the first input of NAND gate 714. Any odd number of inverting delay elements may be used. For an alternative embodiment, any combination of inverting and/or non-inverting delay elements may also be used. Additionally, each delay element may have the same amount of delay or different amounts of delay. For one embodiment, delay elements 702 and 704 have approximately the same amounts of delay, and delay element 704 has a different amount of delay. The total amount of delay through delay element 702, 704, and 706 may be sufficient to cause NAND gate 714 to deassert CSCINT on line 136 for a sufficient amount of time such that priority encoder 116 may generate the proper state of /MFINT on line 148. Each delay element may include a resistor, RC network, inverter, or other delay circuitry. Generator 700 also includes a second delay path that includes inverting delay element 708, inverter 710 and NAND gate 712. Inverting delay element 708 may have its input coupled to CLK 178 and its output coupled to the first input of NAND gate 712. Inverter 710 may have its input coupled to CLK 178 and its output coupled to the second input of NAND gate 712. The output of NAND gate 712 may be coupled to the second input of NAND gate 714. The output of NAND gate 714 may provide CSCINT on line 136. Delay element 708 may comprise the same delay element as any of delay elements 702, 704, or 706.

Figure 8:
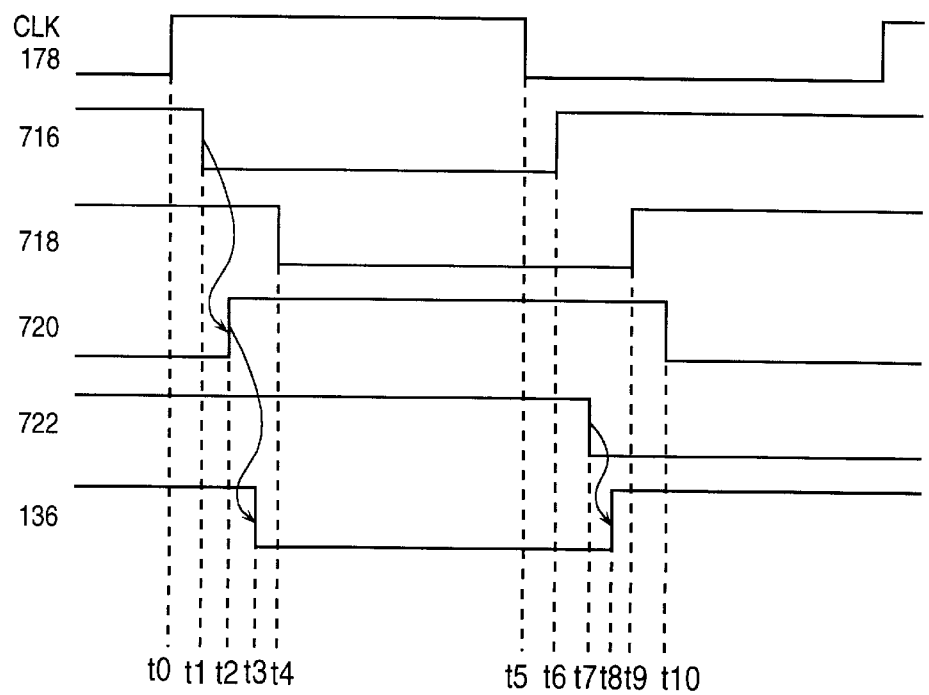
FIG. 8 is a timing diagram illustrating the operation of the cascade logic of FIG. 7.

The operation of generator 700 may be described with the aid of the illustrative timing diagram of FIG. 8. At time t0, CLK 178 transitions to a high state causing the signal on line 716 to transition to a low state at time t1 and the signal on line 720 to transition to a high state at time t2. The high signal on line 720 will cause CSCINT on line 136 to be deasserted and transition to a low state at time t3. After a delay through delay element 708, the signal on line 718 will also transition to a low state at time t4. After a delay through delay elements 702, 704, and 706, the signal on line 722 will transition to a low state at time t7 and cause NAND gate 714 to assert CSCINT to a high state at time t8. Thus, CSCINT may be deasserted for a predetermined amount of time from time t3 to time t8. It will be appreciated that the second delay path may function to not allow the falling edge of CLK 178 at time t5 to assert CSCINT on line 136 before the rising edge of CLK 178 has propagated through the first delay path of delay element 702, 704, and 706.

Again with respect to FIG. 5, if CAM device 100 determines that there is a match at step 510, then instruction decoder 128 may provide a signal to timing generator 126 indicating that the remaining steps of a compare operation, for example, should be completed by CAM device 100. As a comparison has already been made between the comparand data and the data stored in CAM array 104, timing generator 126 may then generate the additional signals required on lines 176, 166, 168 and/or 170 to cause the highest priority match address, any data stored in memory locations associated with the highest priority match address, and other status information to be output to ADS BUS 142. The compare operation may be completed in the same clock cycle that the LEARN instruction is provided to CAM device 100, or it may be completed in later clock cycles.

In general, the compare operation at step 512 may select address data stored at the highest priority matching location in CAM array 104 by CAM device 100 first asserting a signal on line 176 to cause address latch 118 to latch the highest priority address and provide the address to address selector 110 via bus 162. Alternatively, the highest priority match address may be provided directly to address selector 110 without first being stored in address latch 118. Timing generator 126 may then generate a signal on line 166 causing address selector 110 to provide the highest priority address to address decoder 112. Address decoder 112 may then provide the decoded address to CAM array 104 in response to a signal on line 168. Alternatively, a signal on line 168 may not be required. CAM array 104 may then access the highest priority match address in CAM array 104 and selected data may be read out and supplied to output multiplexer 134 and status register 132 via sense amplifiers 122. Sense amplifiers 122 may be enabled, or their outputs latched by a signal on line 170. The selected data may be stored in one CAM cell, groups of CAM cells, and/or CAM cells that did not participate in the previous search. The highest priority match address on bus 146, the data from CAM array 104 on bus 152, the validity bits on bus 157, and/or the flag information on lines 156 and 148 may then be output to ADS BUS 142 via output multiplexer 134. The compare operation of step 512 may be executed such that valid data is output to ADS BUS 142 by time t10.

If a match is not found at step 510, CAM device 100 then determines if CAM array 104 is full. If CAM array 104 is full, then there is no free address at which the comparand data may be stored. Thus, the process may stop at step 516. Instruction decoder 128 may monitor FFEN on line 182 to determine if CAM array 104 is full. For an alternative embodiment, CAM device 100 may perform step 514 earlier in the process. For example, CAM device 100 may perform step 514 between steps 502 and 506.

Figure 9:
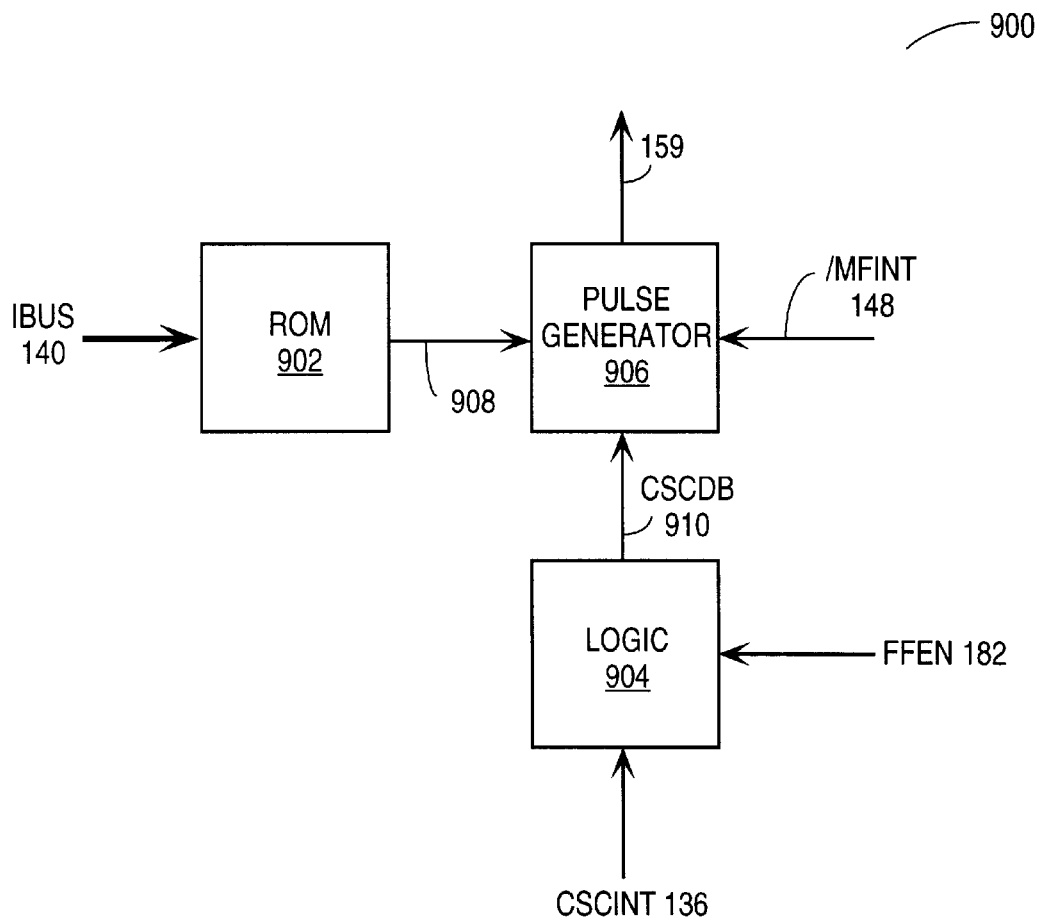
FIG. 9 is a block diagram of one embodiment of the instruction decoder of FIG. 1.

If there is no match and CAM array 104 is not full, then instruction decoder 128 may then output a signal on line 159 at time t7 that causes timing generator 126 to generate signals on lines 164 and 180. One embodiment of instruction decoder 126 that generates this signal on line 159 is shown in FIG. 9. Other embodiments of an instruction decoder may be used. Instruction decoder 900 of FIG. 9 includes read only memory (ROM) 902, logic 904, and pulse generator 906. For one embodiment, ROM 902 may be a look-up table (LUT). Pulse generator 906 generates the signal on line 159 in response to /MFINT on line 148, CSCDB on line 910, and a signal on line 908 indicating that the LEARN instruction has been received from IBUS 140. CSCDB is asserted to a low state by logic 904 when CSCINT is high and FFEN is high (i.e., when CAM device 100 is not full). For one embodiment, logic 904 includes a two input NAND gate having one input coupled to FFEN and the other input coupled to CSCINT 136, and its output coupled to line 910. For one embodiment, the signal on line 159 is used as /LEX. For another embodiment, the signal on line 159 is latched (by a CLK 178 or a derivative thereof), buffered, and output from CAM 100 as /LEX.

Figure 10:
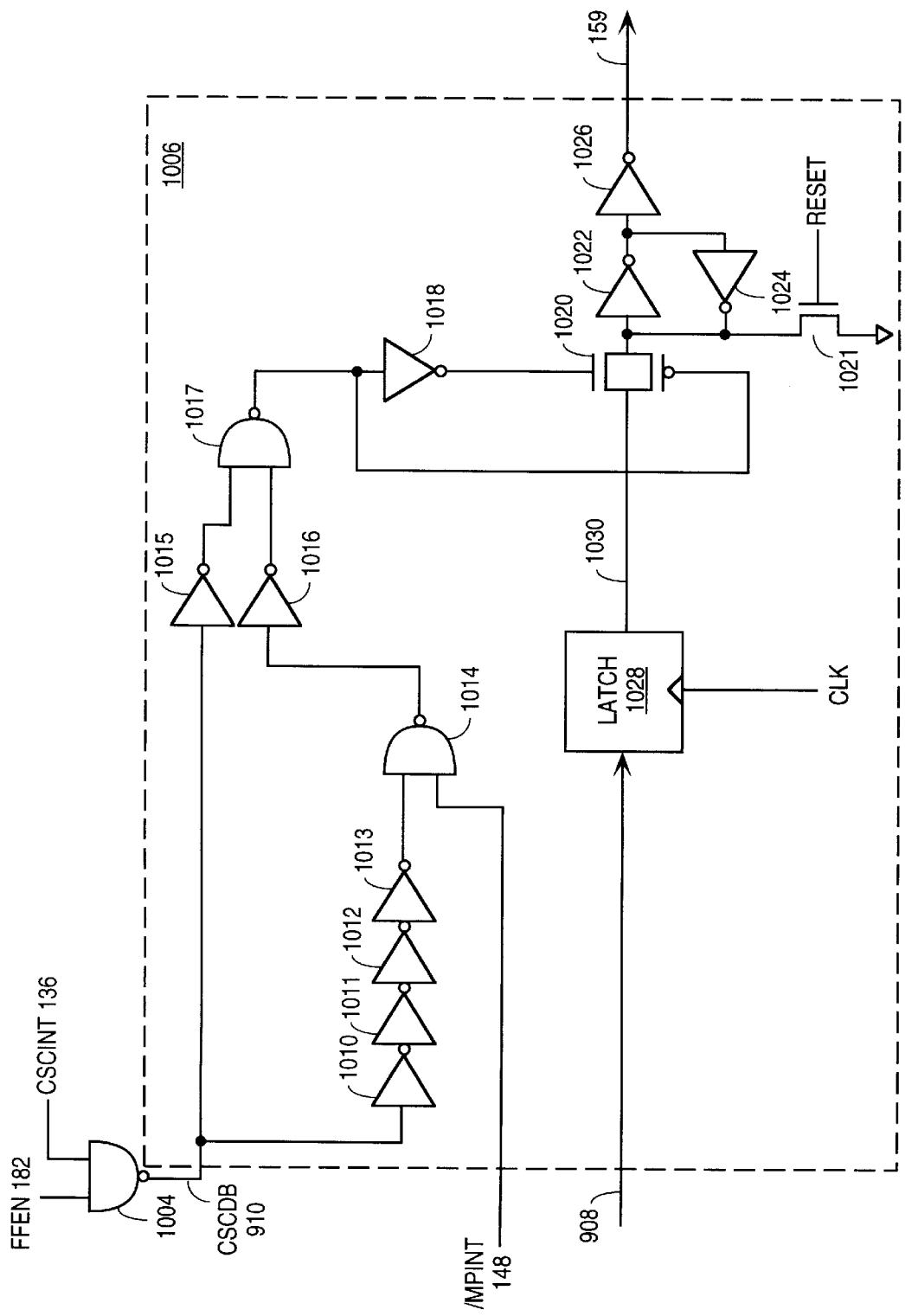
FIG. 10 is a logic diagram of one embodiment of the pulse generator circuit of FIG. 9.

FIG. 10 shows pulse generator circuit 1006 coupled to NAND gate 1004. NAND gate 1004 is one embodiment of logic 904, and circuit 1006 is one embodiment of pulse generator 906. Other pulse signal generators may be used. Circuit 1006 includes NAND gate 1014 that has a first input coupled to /MFINT, and a second input coupled to CSCDB via series-connected inverters 1010, 1011, 1012, and 1013. The output of NAND gate 1014 is coupled to a first input of NAND gate 1017 via inverter 1016. The second input of NAND gate 1017 is coupled to CSCDB via inverter 1015. Circuit 1006 also includes transmission gate 1020 that has its p-channel gate coupled to the output of NAND gate 1017, and its n-channel gate coupled to the output of NAND gate 1017 via inverter 1018. Circuit 1006 further includes latch 1028 that latches the signal provided from ROM 902 and provides this signal to line 159 via inverters 1022 and 1026 when transmission gate 1020 is enabled by NAND gate 1017. A feedback inverter 1024 coupled to inverter 1022 and transistor 1021 may also be provided. Transistor 1021 may reset the state of signal 159 at the end of a clock cycle (i.e., of CLK 178) in response to a reset signal.

In operation, ROM 902 will assert a signal to a high logic state on line 908 when it decodes the LEARN instruction. Latch 1028 will latch this signal and provide a high logic signal to the input of transmission gate 1020 at node 1030. Transmission gate 1020 will be normally non-conducting while CSCINT is low (i.e., during times t2–t6 of FIG. 6). When CSCINT transitions to a high state at time t5, then the state of /MFINT on line 148 will determine whether transmission gate 1020 provides the signal on line 1030 to line 159. For example, if /MFINT is low indicating that there is a match in CAM array 104, then transmission gate 1020 will be disabled and the signal on line 159 will remain low. However, if /MFINT is high indicating that there is no match in CAM array 104, then transmission gate 1020 will be enabled and the signal on line 159 will transition to a high state at time t7. Inverters 1010–1013 may provide a time window in which /MFINT may be able to determine whether transmission gate 1020 is enabled. For an alternative embodiment, inverters 1010–1013 may be omitted.

Turning again to FIG. 5, timing generator 126 sends a signal on line 164 at step 518 and time t8. The signal on line 164 causes address selector 110 to provide the next free address stored in next free address register 106 to address decoder 112. Address decoder 112 then decodes the next free address and selects one or more CAM cells in CAM array 104 that correspond to the next free address. Address decoder 112 decodes the address and outputs the decoded address in response to a signal on line 168. Alternatively, address decoder 112 may provide the decoded next free address to CAM array 104 without receiving a signal on line 168.

At step 520 and time t9, timing generator 126 then generates a signal on line 180 that causes write circuit 121 to write the comparand data into the next free address in CAM array 104. Additionally, at step 522 the validity bits for the selected next free address may be updated to indicate that this address now contains valid data and is no longer empty. For one embodiment, a separate write circuit may be used to update the validity bits and, the signal on line 180 or a different signal generated by timing generator 180 may be used for this separate write circuit. It will be appreciated that any conventional write circuit may be used as write circuit 121.

After the comparand data has been written into the next free address at step 520, the validity bits and flags (including, for example, /LEX) may be updated at step 522. For example, flag logic 130 may update the full flag signal on line 156 and FFEN on line 182. Thus, FFINT and FFEN will reflect if CAM array 104 is now full after step 520.

At step 524 and by time t10, output multiplexer 134 may output the next free address location from next free address register 106. This is an optional step that may provide useful information to other circuits or logic communicating with CAM device 100 as it indicates which location in CAM array 104 has just received the comparand data in the LEARN instruction.

Figure 6:
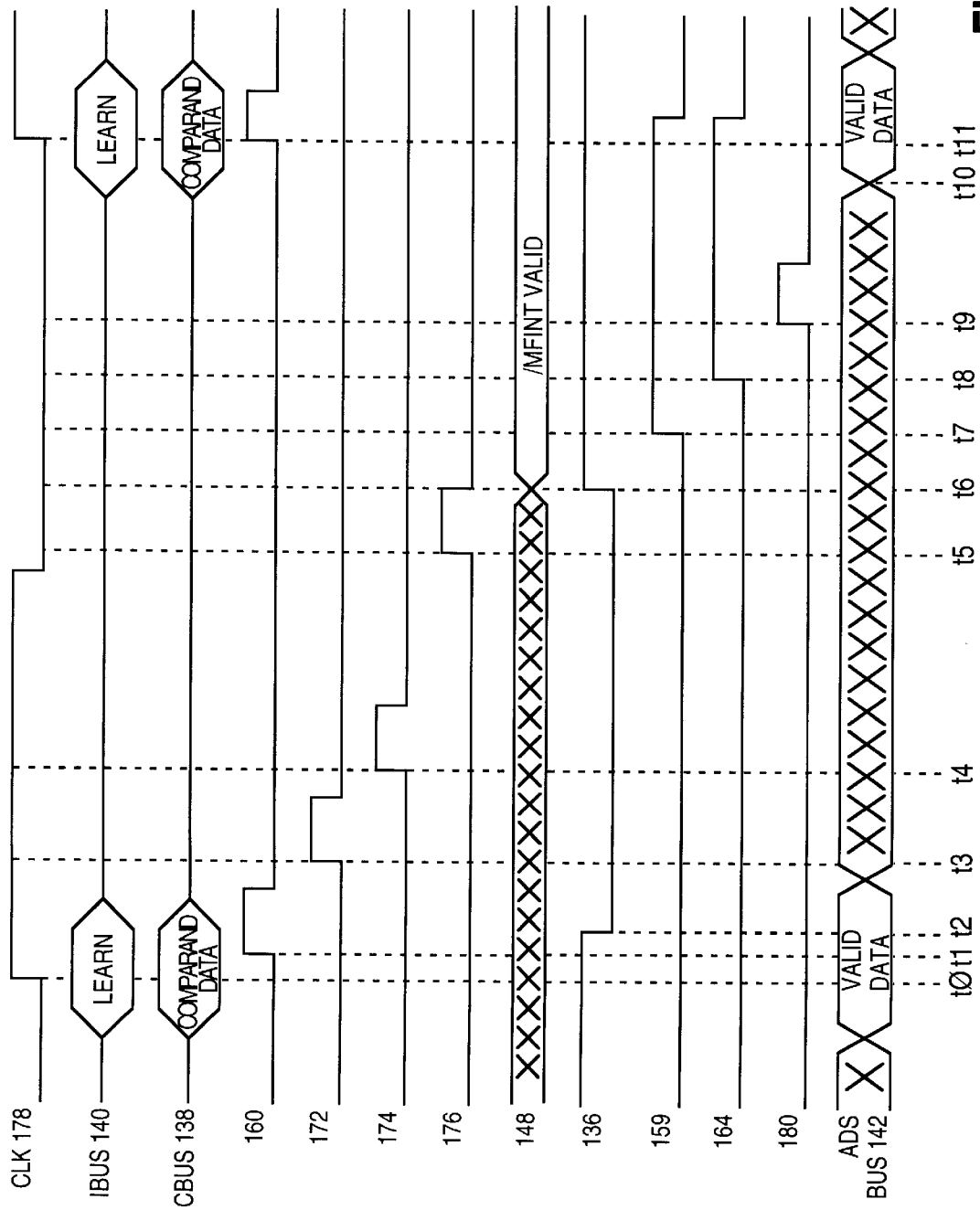
FIG. 6 is a timing diagram for one embodiment implementing the learn instruction of FIG. 5.

As shown in FIG. 6, the LEARN instruction can be completed in a single clock cycle of CLK 178. At time t11, a second subsequent LEARN instruction can be started such that LEARN instructions can be completed in consecutive clock cycles. This enables CAM device 100 to be loaded with non-repetitive data at a sustained maximum search rate. For alternative embodiments, the internal signals generated by timing generator 126 may be delayed relative to CLK 178 so as to complete the LEARN instruction in a greater number of clock cycles.

For an alternative embodiment, step 520 may be completed prior to step 506 and the signals on line 164 and 180 may be generated earlier in the clock cycle. For this embodiment, the validity bits are not updated by the signal on line 180 such that the data loaded into the next free address does not participate in the search of step 506. An additional signal may be generated by timing generator 126 that causes write circuit 121, for example, to update the validity bits for the next free address at approximately time t8.

The time differences between the signals by timing generator 126 are sufficient to allow the operations described above to function properly under anticipated, characterized, or specified process, temperature, and supply voltage ranges. For one embodiment, the clock period of CLK 178 (i.e., t11–t0) may be approximately 25 nanosecond (ns) and the sustained maximum search rate may be approximately 40 million searches per second. It will be appreciated that faster or slower clock frequencies and search rates may be implemented by CAM device 100.

The signals generated by timing generator 126 are shown in FIG. 6 as pulse signals. For alternative embodiments, a rising or falling edge of a signal may be generated instead of a pulse signal. The pulse signals may also be programmable or adjustable to have any pulse width.

Figure 11:
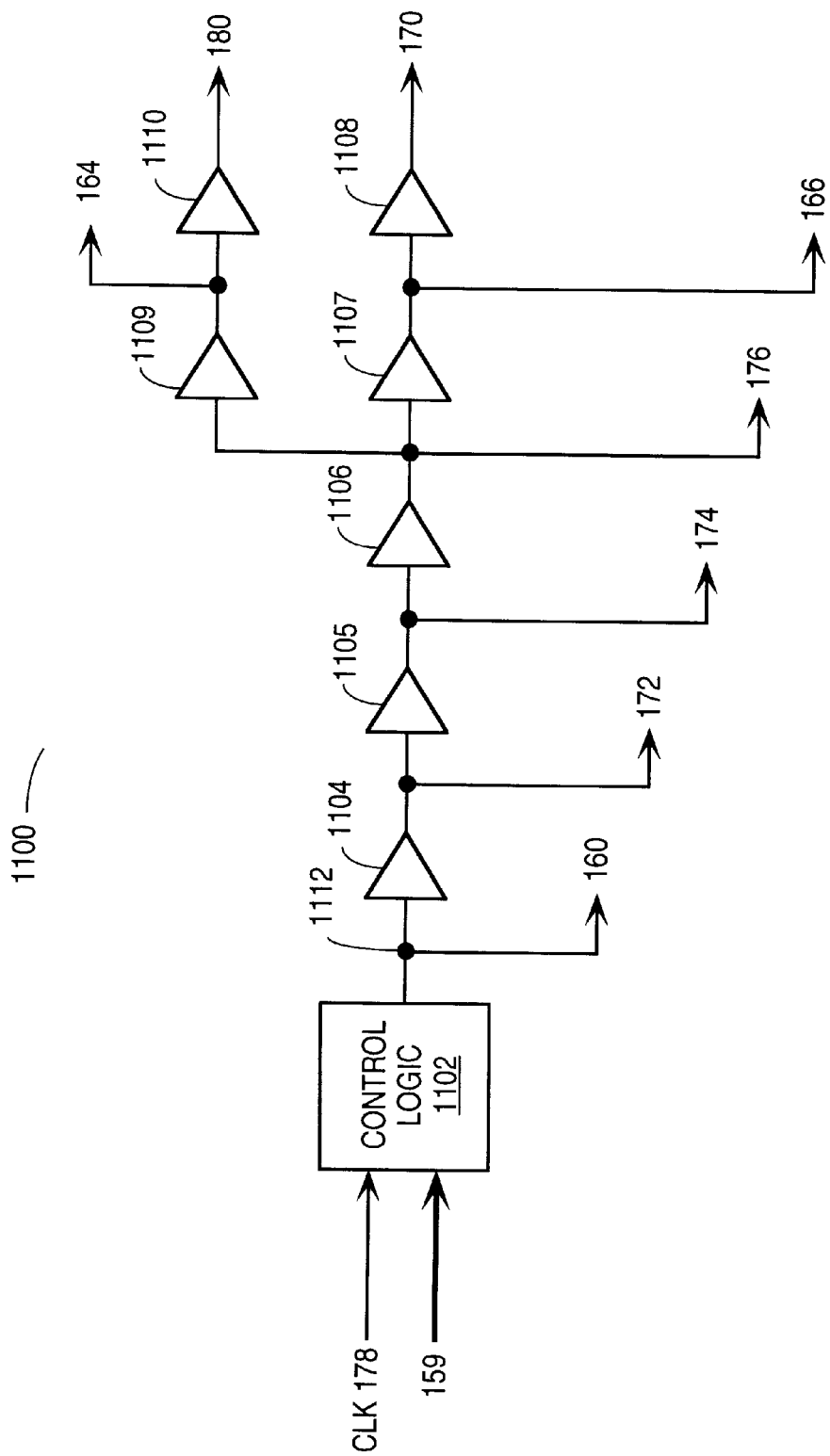
FIG. 11 is one embodiment of the timing generator of FIG. 1.

Timing generator 126 may be any timing generator circuit that generates the pulses on lines 160, 172, 174, 176, 164, 166, 168, 170, and 180 at the appropriate times. FIG. 11 shows timing generator 1100 that is one embodiment of timing generator 126 of FIG. 1. Timing generator 1100 includes control logic 1102 that generates one or more clock signals on line 1112. Control logic 1102 may be a pulse generator circuit. The pulse signal on line 1112 may be delayed by a series of delay elements 1104, 1105, 1106, 1107, 108, 1109, and 1110 that may be used to generate the signals on lines 172, 174, 176, 166, 170, 164, and 180, respectively. Delay elements 1104–1109 may include, for example, resistors, capacitors, transistor pass gates, inverting buffers, and/or non-inverting buffers. Each delay element may also include a programmable element that enables a user or manufacturer to program the delay and/or pulse width of each of the delay elements so that the pulses on lines 160, 172, 174, 176, 164, 166, 170, and 180 may be generated at the appropriate times.

For an alternative embodiment, control logic 1102 or other clock circuitry may generate a plurality of signals at different times, and timing generator 126 may include circuitry that selectively enables each of the clock signals to be coupled to lines 160, 172, 174, 176, 164, 166, 170, and 180 at the appropriate times.

For still another embodiment, CAM device 100 may clock circuitry that generates a clock signal that has a frequency that is n times the frequency of CLK 178, where n is greater than one. Timing generator 126 may be a state machine or counter that consecutively generates the signals on lines 160, 172, 174, 176, 164, 166, 170, and 180 once per clock cycle of the clock signal generated by the clock circuitry.

Figure 12:
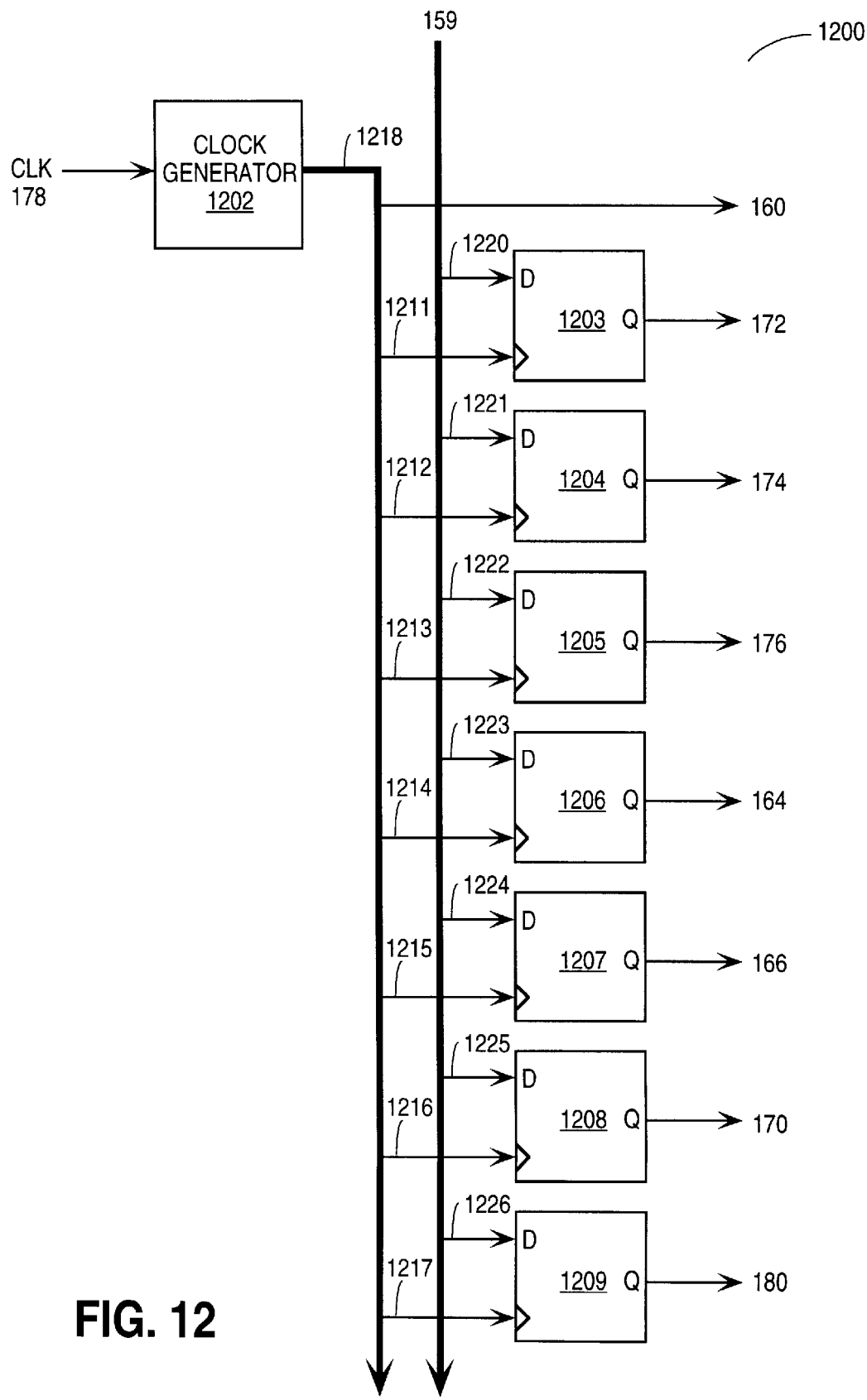
FIG. 12 is another embodiment of the timing generator of FIG. 1.

FIG. 12 illustrates timing generator 1200 that is another embodiment of timing generator 126 of FIG. 1. Timing generator 1200 includes a clock generator 1202 and latches 1203–1209. Clock generator 1202 generates one or more clock signals on bus 1218 in response to CLK 178. The clock signals on bus 1218 may be pulse signals or edge transitions, and may be of any pulse width. For one embodiment, the clock signals on bus 1218 include pulse signals that are approximately 2 to 6 ns in duration. The clock signals from bus 1218 are provided to the clock inputs of latches 1203–1209. For example, one or more clock signals on lines 1211, 1212, 1213, 1214, 1215, 1216, and 1217 are coupled to the clock inputs of latches 1203, 1204, 1205, 1206, 1207, 1208, and 1209, respectively. The signals on lines 1211–1217 may be the same signal or different signals. For one embodiment, the signals on lines 1211–1217 may be pulse signals that start at the beginning of a clock cycle, the middle of clock cycle, at the end of a clock cycle, or at any other predetermined time within a clock cycle. Latches 1203, 1204, 1205, 1206, 1207, 1208, and 1209 may be self-timed latches that generate pulse signals on lines 172, 174, 176, 164, 166, 170, and 180, respectively, in response to data input signals on lines 1220, 1221, 1222, 1223, 1224, 1225, 1226, respectively (from bus 159 output by instruction decoder 129 of FIG. 1) and the assertion of clock signals on lines 1211–1217.

It will be appreciated that the signals generated by timing generator 126 may be generated in response to a transition of CLK 178 or another internal clock signal. It will also be appreciated that the signals generated by timing generator 126 may alternatively occur over more than one clock cycle of CLK 178. Preferably, the signals span less than four clock cycles of CLK 178. For yet another embodiment, CLK 178 may run at a higher or lower frequency than an internal clock signal that may be used to start the sequence of signals output by timing generator 126.

As described above, CAM device 100 can implement a LEARN instruction in as fast as a single clock cycle. CAM device 100 may also be included in a CAM system that has multiple CAM devices connected in a depth cascade configuration. Depth cascading of CAM devices effectively results in generating a CAM device that has a larger number of memory locations.

Figure 13:
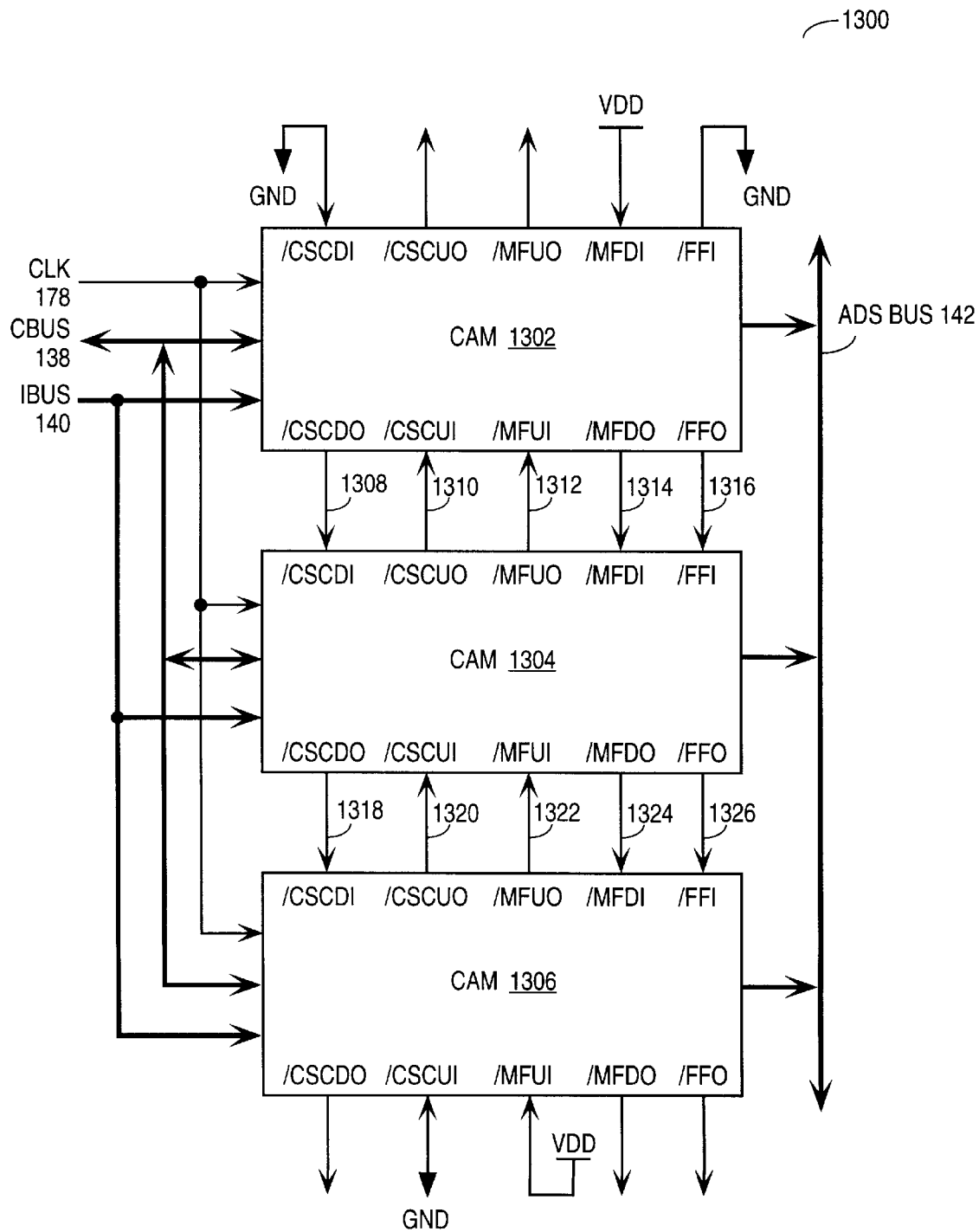
FIG. 13 is a block diagram of one embodiment of cascading CAM devices to implement a LEARN instruction.

FIG. 13 shows a CAM system 1300 that includes three CAM devices 1302, 1304, and 1306 interconnected in a depth cascade configuration. Any number of CAMs may be depth cascaded as shown in FIG. 13. The total memory size of system 1300 may be larger than the individual sizes of each of CAMs 1302–1306. For example, if each CAM device is a 4 k×64 CAM device, then system 1300 may operate as a 12 k×64 CAM device. Any size of CAM devices may be used in the present invention. Also, CAMs of different widths may be cascaded together. Additionally, system 1300 may be formed from stand-alone CAM devices, or may be formed from integrated circuits on a common substrate.

Each CAM device receives in parallel clock signal CLK 178, comparand data from CBUS 138, and instructions from IBUS 140. For alternative embodiments, CBUS 138 and IBUS 140 may be the same bus. Other input signals may also be simultaneously provided to each of CAMs 1302–1306 including word enable signals, reset signals, chip enable signals, and the like. CAMs 1302–1306 may also output data to ADS BUS 142. Each CAM device 1302–1306 may include the circuitry shown in FIG. 1 such that each CAM device may perform the LEARN instruction in one or more clock cycles.

CAM devices 1302–1306 may each include a cascade down input pin /CSCDI, a cascade down output pin /CSCDO, a cascade up input pin /CSCUI, a cascade up output pin /CSCUO, a full flag input pin /FFI, a full flag output pin /FFO, a match flag down input pin /MFDI, a match flag down output pin /MFDO, a match flag up input pin /MFUI, and a match flag up output pin /MFUO. Each CAM device generally has its /CSCDO output pin coupled to the /CSCDI input pin of the next device, its /CSCUO output pin coupled to the /CSCUI pin of the previous device, its /CSCDI input pin coupled to the /CSCDO of the previous device, its /CSCUI input pin coupled to the /CSCUO pin of the next device, its /MFDO output pin coupled to the /MFDI pin of the next device, its /MFUO output pin coupled to the /MFUI pin of the previous device, its /MFDI input pin coupled to the /MFDO pin of the previous device, its /MFUI input pin coupled to the /MFUO pin of the next device, its /FFI input pin coupled to the /FFO output pin of the previous device and its /FFO output pin coupled to the /FFI input of the next device. The term "previous device" refers to the CAM device that has the next higher (or lower) priority addresses relative to the current device. For example, CAM 1302 may be the "previous device" for CAM 1304. Similarly, the term "next device" refers to the CAM device that has the next lower (or higher) priority addresses relative to the current device. For example, CAM 1306 may be the "next device" for CAM 1304.

Each CAM device 1302, 1304, and 1306 may also include a LEARN flag or output pin such as /LEX that is asserted when LEARN instruction results in the updating of CAM array in one of the CAM devices. Each of these output pins may be tied together to generate a system LEARN flag.

CAM 1302 may be designated as the highest priority CAM device by coupling its /CSCDI and /FFI input pins to a first power supply voltage (e.g., ground or approximately zero volts), and coupling its /MFDI pin to a second power supply voltage VDD. For one embodiment, VDD may be from approximately 1.5 volts to approximately 7.0 volts.

Other voltages may be used. The highest priority CAM device may have the lowest physical addresses of, for example, zero to X. The next highest priority CAM device 1304 may have addresses X+1 to N, and CAM device 1306 may have the lowest priority addresses N+1 to M, where system 1300 has a total of M CAM words available for storage. For alternative embodiments, CAM 1302 may have the lowest priority addresses, and CAM 1306 may have the highest priority addresses.

A LEARN instruction is simultaneously provided to each of CAMs 1302–1306 in system 1300. In response to the LEARN instruction, each CAM device compares the comparand data with the data stored in its CAM array. If a match is found in one of the CAMs, then that CAM device asserts a match flag output signal on each of pins /MFDO and /MFUO to indicate to the CAM devices down and up in the cascade that that CAM device has a match. Each CAM device may also provide a signal on its /CSCDO and /CSCUO pins indicating when the /MFDO and /MFUO flags are valid and may be sampled by the other CAMs. The CAM device that has the highest priority match with comparand data provided on CBUS 138 may then output its matching address, associated data, and/or status information to ADS BUS 142 in the same clock cycle as receiving the LEARN instruction, or in a later clock cycle. If, however, no CAM device stored data matching the comparand data for the LEARN instruction, then the CAM device with the next free address of system 1300 may load the comparand data into its CAM array, and may output its next free address to ADS BUS 142. Each CAM device may monitor the full flag and match flags of both the CAM devices above and below to determine if they contain the next free address for system 1300. For example, if CAM 1302 is full, CAM 1304 is partially full, and CAM 1306 is empty, then both CAM 1304 and 1306 will have a next free address within each CAM device. CAM 1304, however, will have the next free address for system 1300 because of its relative placement in the cascade. CAM 1304 will know that it can load the comparand data into its next free address by determining that CAMs 1302, 1304, and 1306 don't have a match (e.g., /MFDI, /MFINT, and /MFUI inactive), that CAM 1302 is full (/FFI low), and that its own internal full flag indicates that CAM 1304 is not full. CAM 1306 will know that it does not have the next free address for system 1300 because its /FFI pin will not be driven low by CAM 1304.

Figure 14:
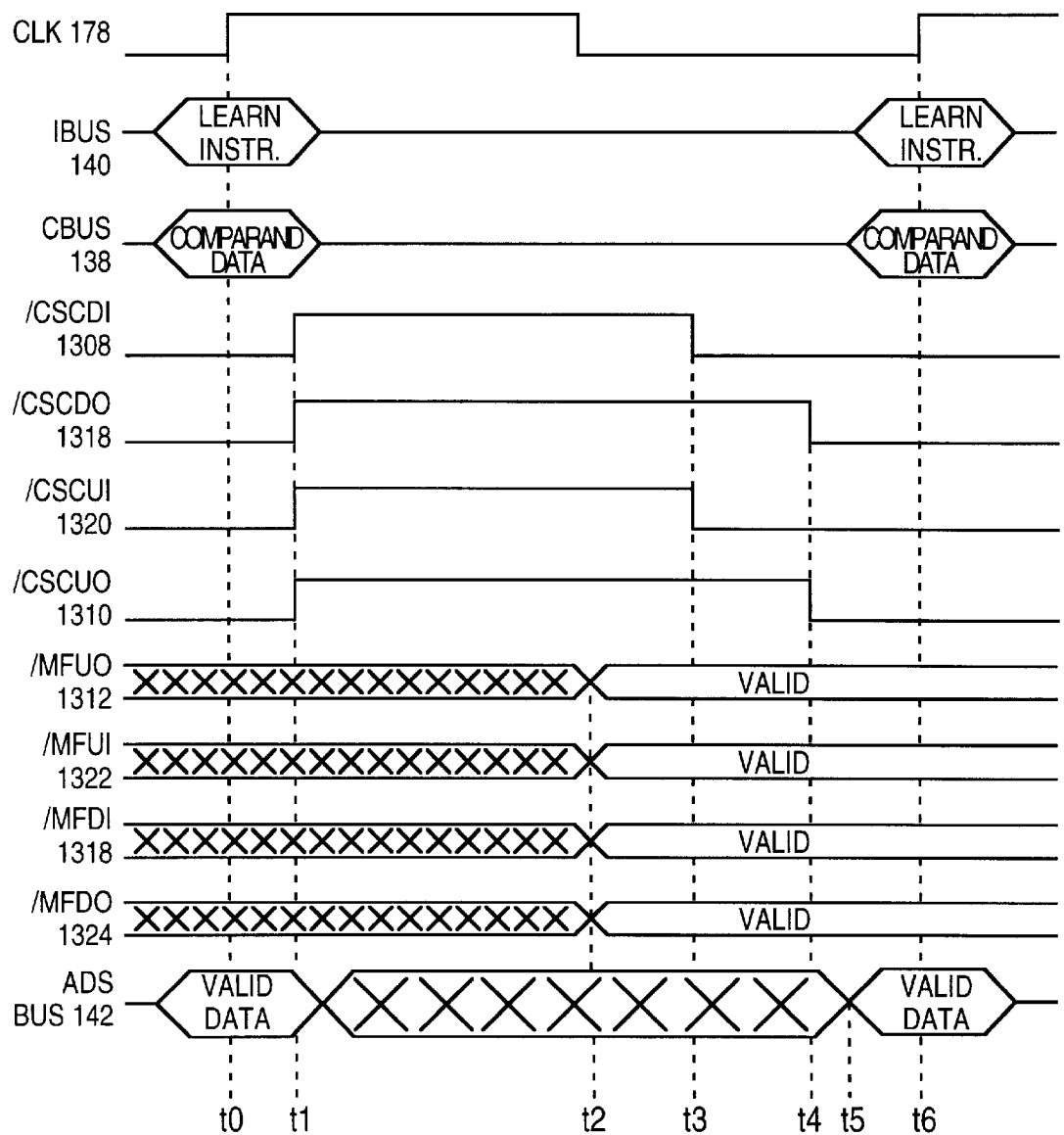
FIG. 14 is a timing diagram of the operation of one of the CAM devices of FIG. 13.

The operation of system 1300 may be illustrated with the aid of the illustrative timing diagram of FIG. 14. FIG. 14 shows the signals that may be generated or received by CAM device 1304. Each of CAMs 1302 and 1306 may operate in a similar manner. At time t0, CLK 178 transitions to a high state enabling CAMs 1302–1306 to load and decode the LEARN instruction. Each device may then compare the comparand data with the data stored in its CAM array to determine if there is a match. The match flags /MFDO and /MFUO may then be set accordingly at time t2.

At time t1, each CAM deasserts its /CSCDO and /CSCUO pins to a high state. When CAM 1304 detects that /CSCDI on line 1308 is deasserted by CAM 1302, it may be disabled from asserting /CSCDO on line 1318 to a low state and from taking control of ADS BUS 142. CAM 1302 may continue to deassert line 1308 for a predetermined amount of time (i.e., until time t3) sufficient for CAM 1302 to compare the comparand data with data stored in its CAM array, and for CAM 1302 to generate /MFDO on line 1314. Thus, when /CSCDI on line 1308 is asserted, CAM 1304 knows that CAM 1302 has compared the comparand data with its internal CAM array and that its compare results are now valid on /MFDI line 1314. CAM 1304 may then assert its /CSCDO on line 1318 at time t4. Similarly, when CAM 1304 detects that /CSCUI on line 1320 is deasserted by CAM 1306, it may be disabled from asserting /CSCUO on line 1310 to a low state and from taking control of ADS BUS 142. CAM 1306 may continue to deassert line 1320 for a predetermined amount of time (i.e., until time t3) sufficient for CAM 1306 to compare the comparand data with data stored in its CAM array, and for CAM 1306 to generate /MFUO on line 1322. Thus, when /CSCUI on line 1320 is asserted, CAM 1304 knows that CAM 1306 has compared the comparand data with its internal CAM array and that its compare results are now valid on /MFUI line 1322. CAM 1304 may then assert its /CSCUO on line 1310 at time t4. /CSCDO and /CSCUO may be asserted at different times due to CAM devices having different speeds and/or /CSCDI and /CSCUI arriving at CAM 1304 at different times.

If CAM 1304 determines that /MFDI is asserted when CAM 1302 asserts /CSCDI at time t3, then CAM 1304 knows that a higher priority device has a match. CAM 1304 will then not complete the LEARN instruction, that is, CAM 1304 will not load the comparand data into its CAM array and will not take control of ADS BUS 142 even if CAM 1304 has a match. If CAM 1304 determines that /MFDI is not asserted by CAM 1302 at time t3, but that /MFUI has been asserted on line 1322 indicating a match in CAM 1306, then CAM 1304 will not complete the LEARN instruction. If however, CAM 1304 has a higher priority match than CAM 1306, then CAM 1304 may take control of ADS BUS 142 and may output its highest priority match address, associated data, and/or status information to ADS BUS 142 by time t5 (or at a later time). If CAM 1304 detects that neither of CAMs 1302 or 1306 have matches when /CSCDI and /CSCUI are asserted by CAMs 1302 and 1306, respectively, that CAM 1302 is full (/FFI asserted), and if CAM 1304 does not have a match, then CAM 1304 may load the comparand data into the next free address in its CAM array and may output this address to ADS BUS 142 by time t5 (or at a later time). Thus, FIG. 14 illustrates that CAM devices of the present invention may perform a LEARN instruction in a cascade configuration in one cycle (e.g., t6–t0) or more clock cycles.

Figure 15:
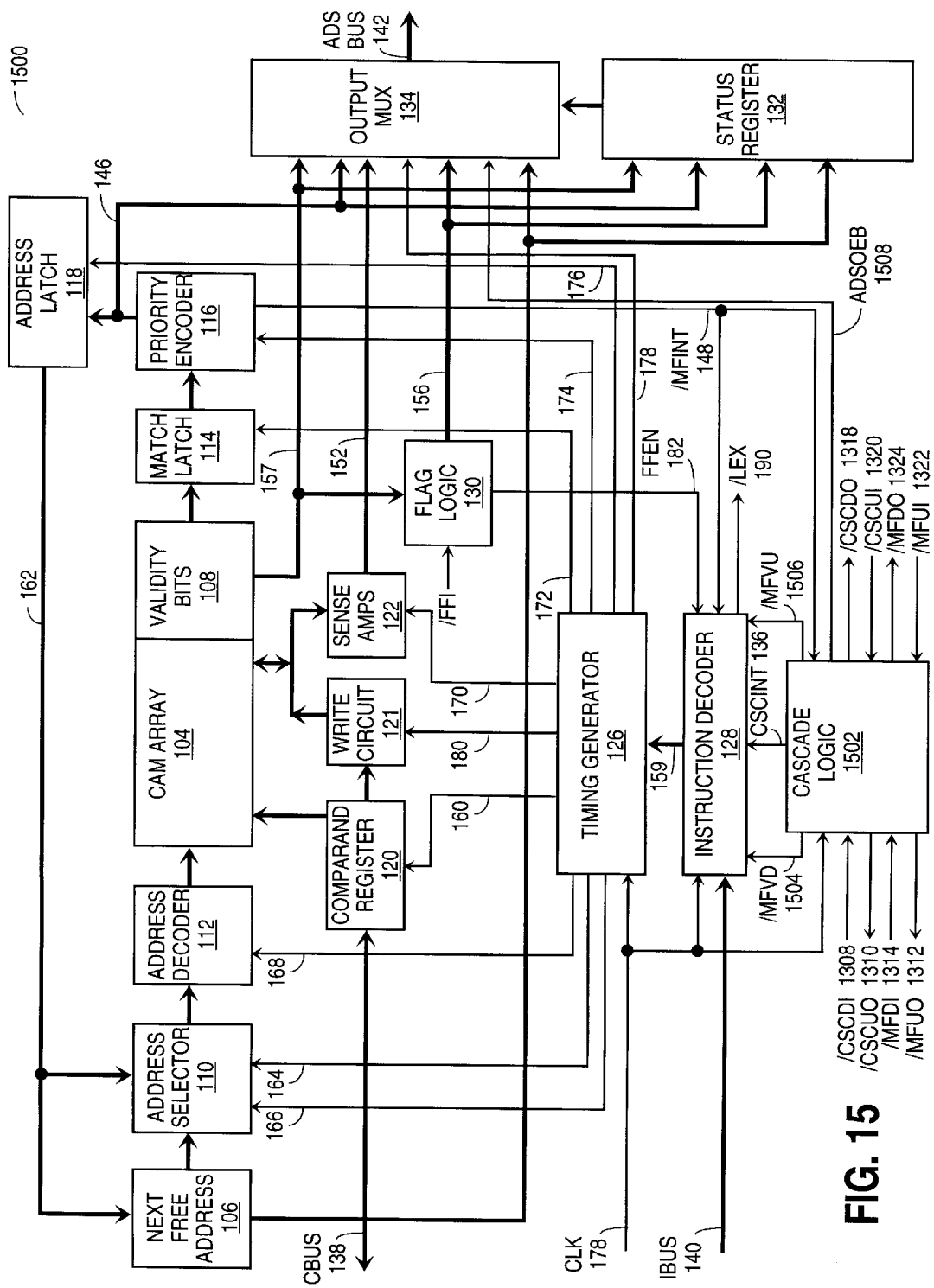
FIG. 15 is a block diagram of one embodiment of a CAM device including cascade logic.

FIG. 15 shows CAM device 1500 that is one embodiment of CAM device 1304. CAM 1500 is CAM device 100 that includes cascade logic 1502. Cascade logic 1502 is coupled to /CSCDI on line 1308, /CSCUO on line 1310, /MFDI on line 1314, /MFUO on line 1312, /CSCDO on line 1318, /CSCUI on line 1320, /MFDO on line 1324, and /MFUI on line 1322. Cascade logic may include signal generator 124 to generate CSCINT 136, and may also include logic to generate /MFVD and /MFVU on lines 1504 and 1506, respectively. /MFVD is a validated down match flag signal that is deasserted to a high logic state when CAM 1302 has completed the match function and indicates that it does not have a match. /MFVU is a validated up match flag signal that is deasserted to a high logic state when CAM 1306 has completed the match function and indicates that it does not have a match. Cascade logic 1502 may also generate ADSOEB on line 1508 that controls when CAM device 1500 may have access to ADS BUS 142.

Figure 16:
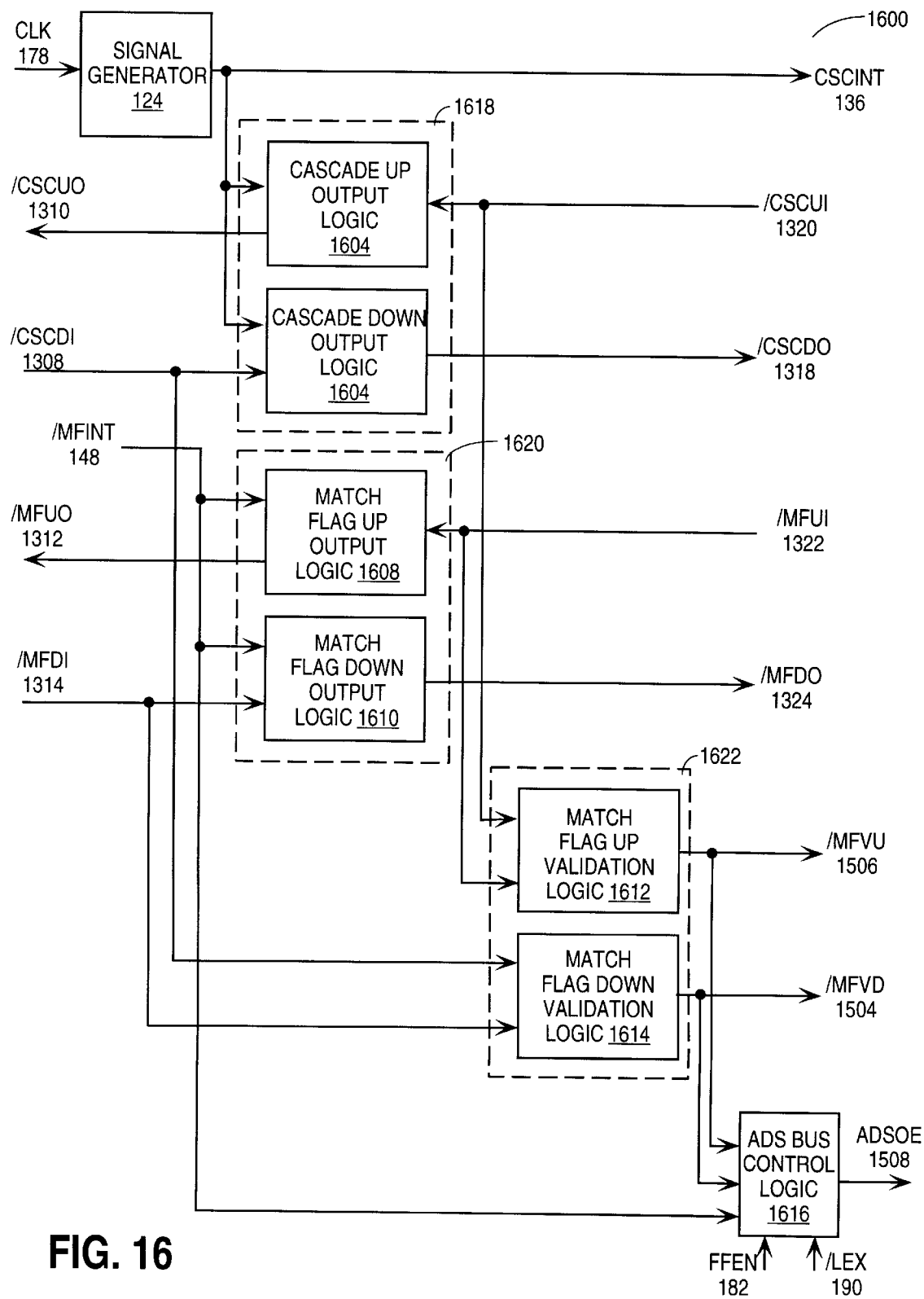
FIG. 16 is a block diagram of one embodiment of the cascade logic of FIG. 15.

FIG. 16 is a block diagram of cascade logic 1600 that is one embodiment of cascade logic 1502 of FIG. 15. Cascade logic 1600 includes signal generator 124, cascade signal generator logic 1618, match flag logic 1620, match flag validation logic 1622, and ADS BUS control logic 1616. Cascade signal generator logic 1618 includes cascade up output logic 1604 that receives /CSCUI and drives /CSCUO, and cascade down output logic 1606 that receives /CSCDI and drives /CSCDO. Match flag logic 1620 includes match flag up output logic 1608 that receives /MFUI and drives /MFUO, and match flag down output logic 1610 that receives /MFDI and drives /MFDO. Match flag validation logic 1622 includes match flag up validation logic 1612 that determines /MFVU in response to /MFUI and /CSCUI. Match flag validation logic 1622 also includes match flag down validation logic 1614 that determines /MFVD in response to /MFDI and /CSCDI. ADS BUS control logic 1616 determines ADSOEB 1508 in response to /MFINT, /MFVU, /MFVD, FFEN, and /LEX.

Signal generator 124 generates CSCINT 136 in response to CLK 178. As previously described, signal generator 124 deasserts CSCINT on line 136 for a period of time sufficient to allow CAM 1304 to determine if there is match with comparand data provided to CAM 1304. During the period of time that CSCINT is deasserted, cascade down output logic 1606 may cause /CSCDO to be deasserted such that CAM 1306 will be inhibited from taking control of ADS BUS 142 until CAM 1304 resolves /MFINT and receives match flag down information from CAM 1302. Signal generator may be any one-shot circuit. One embodiment of signal generator 124 is described above with respect to FIGS. 8 and 9.

Figure 17:
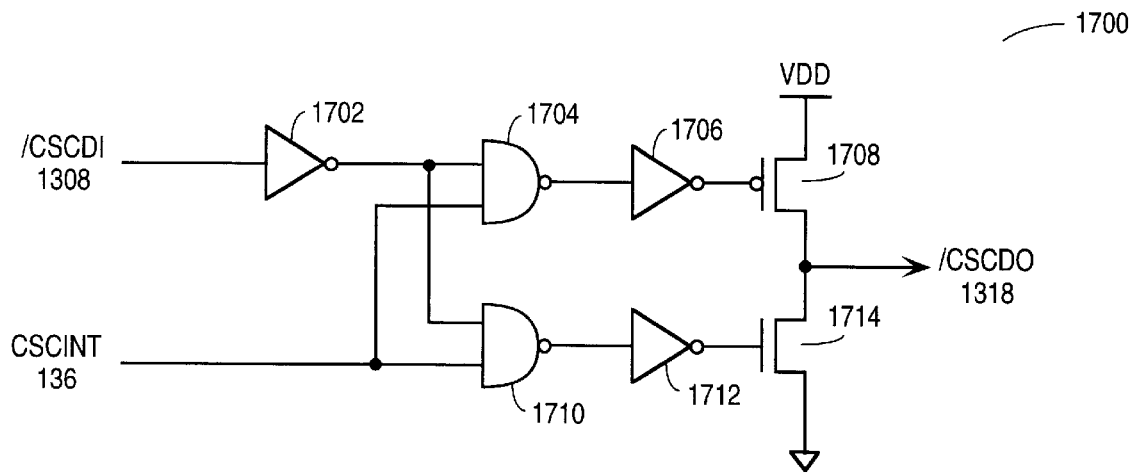
FIG. 17 is a logic diagram of one embodiment of the cascade down output logic or cascade up output logic of FIG. 16.

FIG. 17 is one embodiment of cascade down output logic 1606. Circuit 1700 may also be used for cascade up output logic 1604 by replacing /CSCDI on line 1308 with /CSCUI on line 1320, and by replacing /CSCDO on line 1318 with /CSCUO on line 1310. Other embodiments for cascade output logic may be used.

Circuit 1700 may include NAND gates 1704 and 1710, inverters 1702, 1706, and 1712, PMOS transistor 1708, and NMOS transistor 1714. Inverter 1702 has its input coupled to /CSCDI on line 1308 and its output coupled to the first inputs of NAND gates 1704 and 1710. NAND gates 1704 and 1710 each have their second inputs coupled to CSCINT on line 136. Inverter 1706 has its input coupled to the output of NAND gate 1704, and its output coupled to the gate of PMOS transistor 1708. Inverter 1712 has its input coupled to the output of NAND gate 1710, and its output coupled to the gate of NMOS transistor 1714. PMOS transistor 1708 further has its source coupled to a power supply rail VDD, and its drain coupled to /CSCDO at line 1318. NMOS transistor 1714 further has its drain coupled to line 1318, and its source coupled to rail ground or approximately zero volts.

Figure 18:
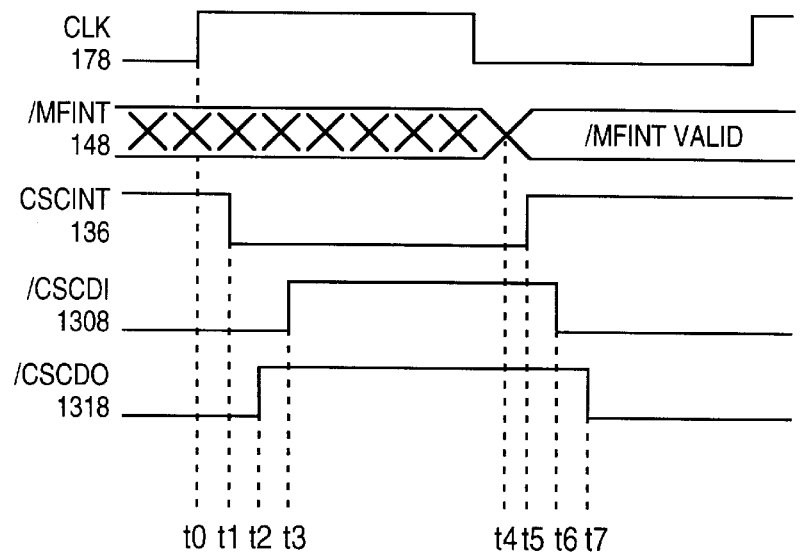
FIG. 18 is a timing diagram of the operation of the logic of FIG. 17.

The operation of cascade output logic 1700 may be illustrated with the aid of the illustrative timing diagram of FIG. 18. Assume that cascade output logic 1700 is included in CAM 1304. When the LEARN instruction is received by CAM 1304 in response to the rising edge of CLK 178 at time t0, signal generator 124 may then generate a one-shot signal on line 136 from time t1 to t5. For another embodiment, CSCINT may be generated in response to each rising edge of CLK 178. The rising edge of CSCINT may cause /CSCDO (and/or /CSCUO) on line 1318 to transition to a high state at time t2 as PMOS transistor 1708 may be on and NMOS transistor 1714 may be off. /CSCDI on line 1308 may transition to a high state at time t3. The one-shot signal on line 136 may transition to a high state after the internal match flag signal /MFINT on line 148 has transitioned to a valid state at time t4. PMOS transistor 1708 will be turned off and NMOS transistor 1714 will be turned on to pull /CSCDO on line 1318 to a low state when /CSCDI on line 1308 is asserted to a low state (indicating that a higher priority CAM device has completed its comparison operation) and CSCINT is asserted to a high state. The low state on line 1318 may indicate that CAM 1304 (and CAM 1302) has completed its comparison operation and the match flag output signal /MFDO on line 1324 is valid.

Figure 19:
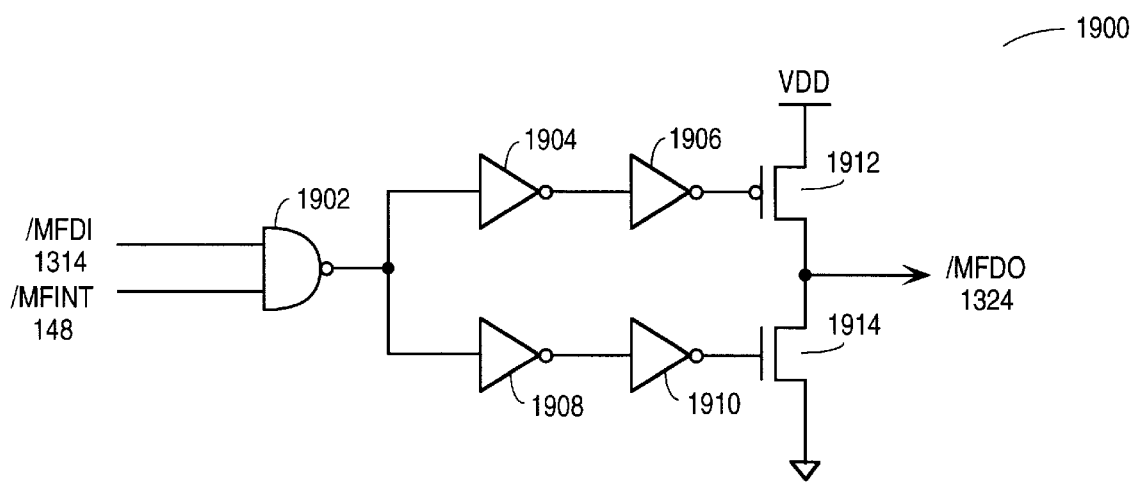
FIG. 19 is a logic diagram of one embodiment of the match flag down output logic or the match flag up output logic of FIG. 16.

FIG. 19 shows one embodiment of match flag down output logic 1610. Circuit 1900 may also be used for match flag up output logic 1608 by replacing /MFDI on line 1314 with /MFUI on line 1322, and by replacing /MFDO on line 1324 with /MFUO on line 1312.

Match flag logic 1900 may include NAND gate 1902, inverters 1904, 1906, 1908, and 1910, PMOS transistor 1912, and NMOS transistor 1914. For an alternative embodiment, inverters 1904, 1906, 1908, and 1910 may be omitted. NAND gate 1902 has its first input coupled to /MFDI on line 1314, and its second input coupled to /MFINT on line 148. The output of NAND gate 1902 is coupled to the gate of PMOS transistor 1912 via the series connected inverters 1904 and 1906. The output of NAND gate 1902 is also coupled to the gate of NMOS transistor 1914 via series connected inverters 1908 and 1910. PMOS transistor 1912 further has its source coupled to VDD and its drain coupled to /MFDO at line 1324. NMOS transistor 1914 further has its drain coupled to line 1324 and its source coupled to ground or approximately zero volts. /MFDO will only be deasserted to a high state if neither /MFDI or /MFINT is asserted to a low state. This embodiment may be used in depth cascade systems that generate a composite match flag from the lowest priority CAM device in the cascade. Other embodiments for match flag output logic may be used.

Figure 20:
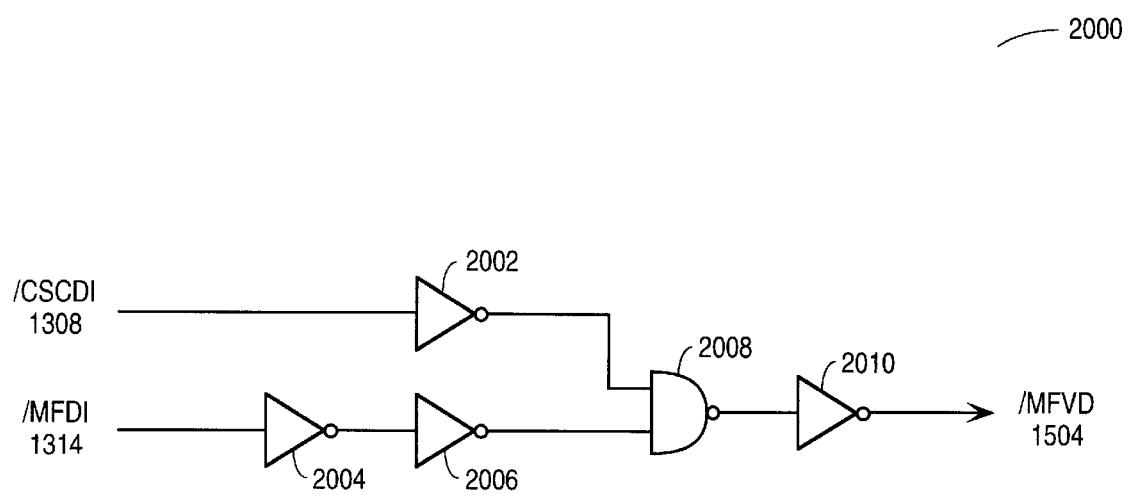
FIG. 20 is a logic diagram of one embodiment of match flag down validation logic or match flag up validation logic of FIG. 16.

FIG. 20 shows one embodiment of match flag down validation logic 1614. Circuit 2000 may also be used for match flag up validation logic 1612 by replacing /MFDI on line 1314 with /MFUI on line 1322, by replacing /CSCDI on line 1308 with /CSCUI on line 1320, and by replacing /MFVD on line 1504 with /MFVU on line 1506.

Match flag down validation logic 2000 may include NAND gate 2008 and inverters 2002, 2004, 2006, and 2010. For an alternative embodiment, inverters 2004 and 2006 may be omitted. NAND gate 2008 has its first input coupled to /MFDI via inverters 2004 and 2006, and its second input coupled to the complement of /CSCDI via inverter 2002. /MFVD may be driven by NAND gate 2008 via inverter 2010. Match flag validation logic 2000 asserts /MFVD to a low state when /CSCDI is high, or when /CSCDI is low and /MFDI is also low. Match flag validation logic 2000 deasserts /MFVD to a high state when /CSCDI is low and /MFDI is high. Thus, /MFVD will be deasserted only when there is no match in CAM 1302. Similarly, the same logic may be used for deasserting /MFVU only when there is no match in CAM 1306. Other embodiments for match flag output logic may be used.

Figure 21:
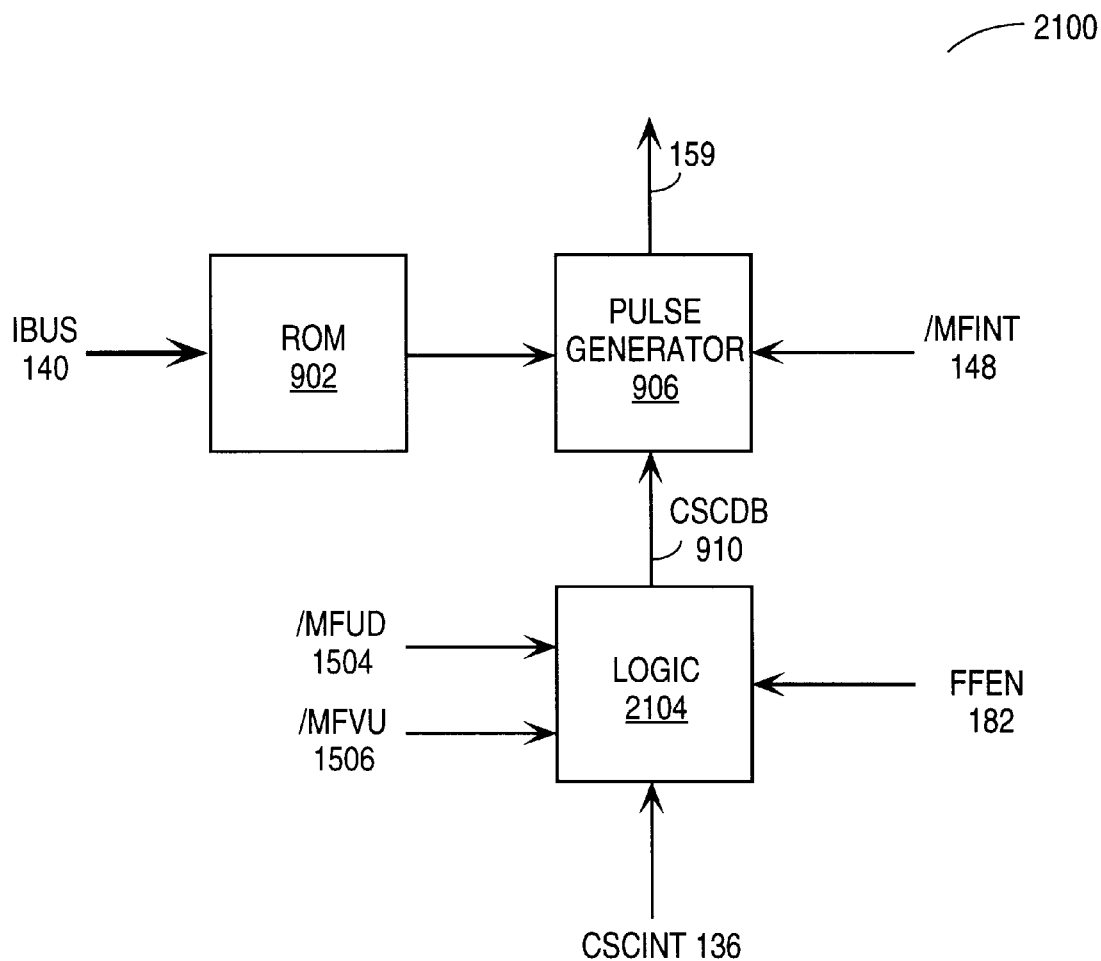
FIG. 21 is a block diagram of another embodiment of an instruction decoder of FIG. 1 for use in a CAM device configured in a depth cascade CAM system.

The validated match flag signals /MFVD and /MFVU generated by match flag validation logic 1622 may be used together with FFEN and CSCINT 136 to generate the signals on line(s) 159 from instruction decoder 128. For example, FIG. 21 shows an exemplary instruction decoder 2100 including logic 2104 that generates CSCDB on line 910 in response to FFEN, CSCINT, /MFVD, and /MFVU. Instruction decoder 2100 is an alternative embodiment of instruction decoder 900 of FIG. 9. For one embodiment, logic 2104 may include a four-input NAND gate with an input coupled to each of FFEN, CSCINT, /MFVD, and /MFVU. Instruction decoder 2104 may be used, for example, by CAM 1304 (and/or the CAMs 1302 and 1306) to generate the signal on line 159 at time t7 in FIG. 6 only if FFEN indicates that full flag input pin /FFI is low (CAM 1302 full), CSCINT is low indicating that the /MFINT has been resolved in CAM 1302, /MFVD is deasserted indicating that CAM 1302 does not have a match, and /MFVU is deasserted indicating that CAM 1306 also does not have a match.

Figure 22:
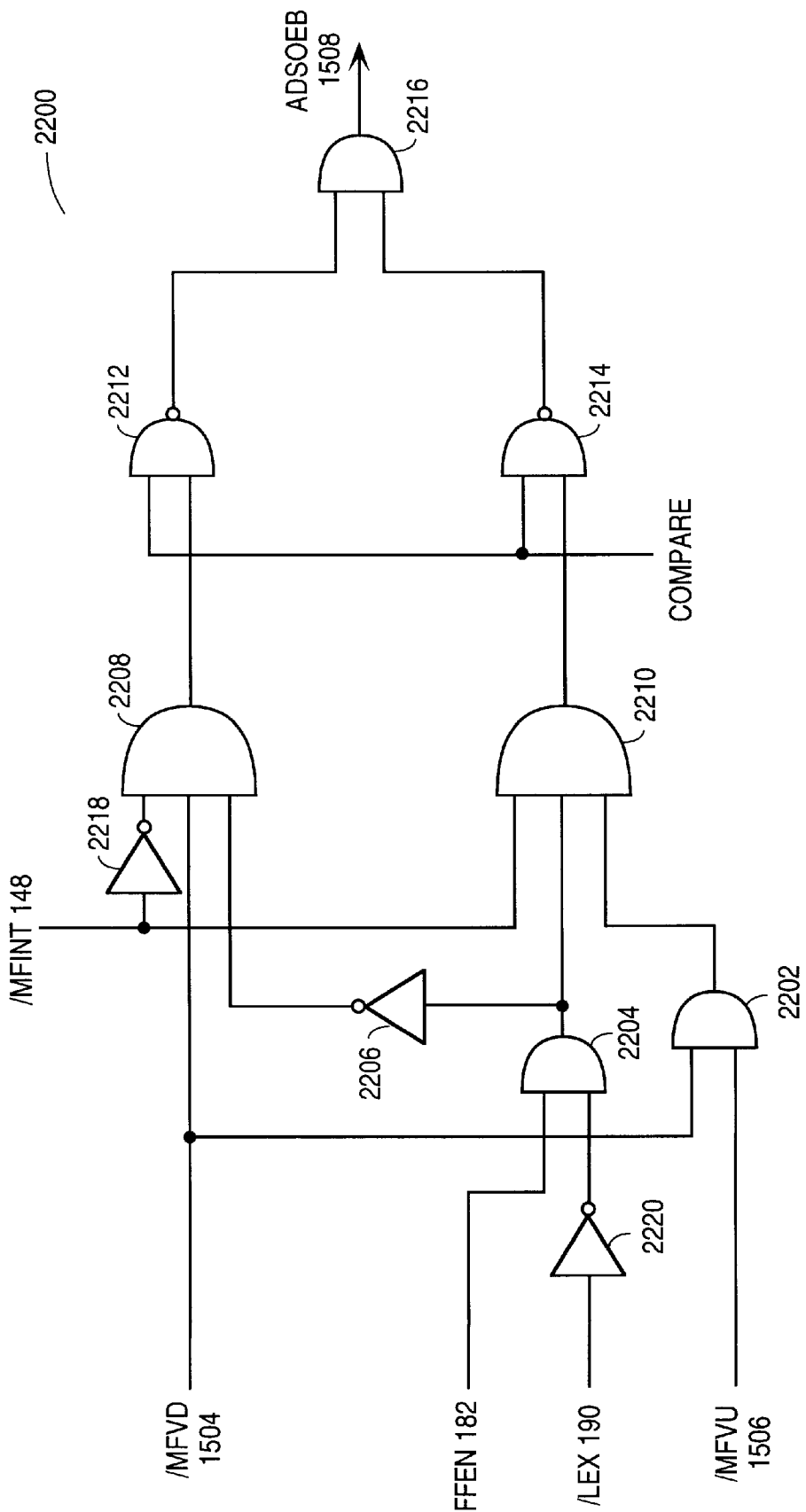
FIG. 22 is a logic diagram of one embodiment of the ADS BUS control logic of FIG. 16.

FIG. 22 shows one embodiment of ADS BUS control logic 1616. Logic 2200 may drive ADSOEB on line 1508 to an appropriate state to control whether output multiplexer 134 may take control of ADS BUS 142. Other embodiments of ADS BUS control logic may be used.

For one embodiment, output multiplexer 134 may output the next free address from CAM 1304 at the end of completing the LEARN instruction as shown in FIG. 14 (and FIG. 6). For another embodiment, output multiplexer may output the highest priority matching address in CAM 1304, data from the CAM array at the highest priority matching address, and/or status information as shown in FIG. 6.

ADS BUS control logic 2200 includes AND gates 2202, 2204, 2208, 2210, and 2216, NAND gates 2212 and 2214, and inverters 2206, 2218, and 2220. NAND gate 2202 has a first input coupled to /MFVU on line 1506 and a second input coupled to /MFVD on line 1504. The output of NAND gate 2202 is coupled to a first input of AND gate 2210. NAND gate 2204 has a first input coupled to FFEN on line 182 (which may be a latched signal), and a second input coupled to the complement of /LEX via inverter 2220. The output of AND gate 2204 is coupled to a second input of AND gate 2210. A third input of AND gate 2210 is coupled to /MFINT on line 148. AND gate 2208 has a first input coupled to the complement of /MFINT via inverter 2218, a second input coupled to /MFVD, and a third input coupled to the complement of the output of AND gate 2204 via inverter 2206. NAND gate 2212 has a first input coupled to the output of AND gate 2208, and a second input coupled to a COMPARE signal. NAND gate 2214 has a first input coupled to the output of AND gate 2210, and a second input coupled to the COMPARE signal. The COMPARE signal may be provided to logic 2200 from instruction decoder 128 or timing generator 126 indicating that a LEARN or other compare operation is occurring in CAM 1304. AND gate 2216 outputs ADSOEB in response to the outputs of NAND gates 2212 and 2214.

Logic 2200 will assert ADSOEB to a low state for CAM 1304 to output its next free address to ADS BUS 142 during a LEARN instruction if FFEN is high indicating that CAM 1302 is full and CAM 1304 is not full, /LEX is low, /MFINT is high indicating that CAM 1304 does not have a match, /MFVU and /MFVD are high indicating that neither of CAMs 1302 or 1306 have a match, and COMPARE is high indicating that a LEARN or other compare operation is being implemented by CAM 1304.

Logic 2200 will also assert ADSOEB to a low state when a highest priority matching location for system 1300 resides in CAM 1304 if /MFINT is low, /MFVD is high, and COMPARE is high (indicating that a compare operation is being implemented by CAM 1304). When CAM 1304 is executing a LEARN instruction, then ADSOEB will be asserted to a low state when FFEN 182 is high, /LEX is low, COMPARE is high, /MFINT is high, and /MFVD and /MFVU are high.

In the foregoing specification the invention has been described with reference to specific exemplary embodiments thereof. It will, however, be evident that various modifications and changes may be made thereto without departing from the broader spirit and scope of the invention. The specification and drawings are, accordingly, to be regarded in an illustrative rather than restrictive sense.

What is claimed is:

1. A method of updating a synchronous CAM device, comprising:
    instructing the CAM device to compare comparand data with data stored in a CAM array in the CAM device;
    writing the comparand data as invalid data to a location in the CAM array;
    comparing the comparand data with valid data stored in the CAM array; and
    subsequently validating the comparand data written into the CAM array if the comparand data does not match the valid data stored in the CAM array.

2. The method of claim 1, wherein the instructing, writing, comparing and validating occur in one clock cycle.

3. The method of claim 1, wherein the writing comprises writing the comparand data to an empty location in the CAM array.

4. The method of claim 1, wherein the writing comprises writing the comparand data to a next free location in the CAM array.

5. The method of claim 1, further comprising outputting an address of the location in the CAM array.

6. The method of claim 5, wherein the instructing, writing, comparing, validating, and outputting occur in less than four clock cycles.

7. The method of claim 6, wherein the instructing, writing, comparing, validating, and outputting occur in one clock cycle.

8. The method of claim 1, further comprising determining if the CAM array is full prior to writing the comparand data into the CAM array.

9. The method of claim 1, further comprising asserting a flag signal when the valdiating is complete.

10. A method of updating a content addressable memory (CAM) device comprising:
    providing an instruction to an instruction decoder within the CAM device:
    decoding the single instruction and in response thereto:
        comparing comparand data with data stored in a CAM array in the CAM device; and
        writing the comparand data to a location in the CAM array.

11. The method of claim 10, wherein the writing further comprises writing the comparand data to the location in the CAM array if the comparand data does not match the data stored in the CAM array.

12. The method of claim 10, further comprising outputting an address of the location in the CAM array.

13. The method of claim 10, wherein the CAM device is a synchronous CAM device and the instruction is performed by the CAM device in less than four clock cycles.

14. The method of claim 10, wherein the CAM device is a synchronous CAM device and the instruction is performed by the CAM device in one clock cycle.

15. The method of claim 10, wherein the location in the CAM array is an empty location.

16. The method of claim 10, wherein the location in the CAM array is a next free location.

17. The method of claim 10, wherein the writing occurs before the comparing.

18. The method of claim 17, wherein the comparand data is marked as invalid for the writing, and the method further comprises validating the written comparand data if the comparand data does not match the data stored in the CAM array.

19. A content addressable memory (CAM) device comprising:

a CAM array having a plurality of CAM cells for storing data;

an input for receiving comparand data; and an instruction decoder coupled to the CAM array and configured to receive and decode an instruction instructing the CAM device to compare the comparand data with the data stored in the CAM array and write the comparand data into an available location in the CAM array if there is no match.

20. The CAM device of claim 19, further comprising an output to provide a flag signal indicative of when the instruction is completed.

21. The CAM device of claim 19, wherein the CAM device is a synchronous CAM device and includes an input for receiving a clock signal.

22. The CAM device of claim 21, wherein the CAM device is configured to execute the instruction in less than four clock cycles.

23. The CAM device of claim 21, wherein the CAM device is configured to execute the instruction in a single clock cycle.

24. The CAM device of claim 19, further comprising a write circuit coupled to the CAM array and configured to write the comparand data into the available location in the CAM array.

25. The CAM device of claim 24, further comprising a storage element configured to store the address of the available location in the CAM array.

26. The CAM device of claim 25, further comprising circuitry coupled to the CAM array and configured to generate a match flag signal, wherein the match flag signal indicates if there is a match between the comparand data and the data stored in the CAM array.

27. The CAM device of claim 24, further comprising full flag logic coupled to the CAM array to generate a full flag signal indicating if the CAM array is full.

28. The CAM device of claim 27, wherein the instruction decoder enables the comparand data to be written into the available location of the CAM address if (i) the match flag indicates that the comparand data does not match data stored in the CAM array, and (ii) the full flag signal indicates that the CAM array is not full.

29. The CAM device of claim 28, further comprising a timing generator coupled to the instruction decoder, the write circuit and the storage element, wherein the timing generator outputs a plurality of signals to the storage element and the write circuit in response to the decoding of the instruction by the instruction decoder.

30. The CAM device of claim 29, wherein the timing generator is configured to provide a first timing signal to the write circuit to write the comparand data into the CAM array before the comparand data is compared with the data stored in the CAM array.

31. The CAM device of claim 30, wherein each location in the CAM array has at least one corresponding memory element for storing an indication of whether the data stored at the corresponding location is valid, and wherein the timing generator is configured to provide a second timing signal to the write circuit to write a valid bit into the memory element for the location in the CAM array of the comparand data if the comparand data does not match the other data stored in the CAM array.

32. The CAM device of claim 28, further comprising a signal generator coupled to the instruction decoder to provide a sampling signal for sampling when the match flag signal is valid.

33. The CAM device of claim 28, wherein the instruction decoder comprises a pulse generator coupled to receive the match flag signal and the full flag signal and output a pulse signal to the timing generator.

34. A content address memory (CAM) device comprising:

a CAM array having a plurality of CAM cells for storing data and comparing valid data with comparand data;

means for decoding an instruction instructing the device to compare the comparand data with data stored in the CAM array;

means for writing the comparand data into the CAM array as invalid data; and means for validating the comparand data in the CAM array when there is no match between the comparand data and the data stored in the CAM array.

35. The CAM device of claim 34, further comprising means for generating a flag signal indicative of when the instruction has been executed by the CAM device.

36. The CAM device of claim 34, further comprising means for outputting from the CAM device the address of where the comparand data is written.

37. The CAM device of claim 34, wherein the CAM device is a synchronous CAM device and includes means for receiving a clock signal.

38. The CAM device of claim 37, wherein the instruction is executed by the CAM device in less than four clock cycles of the clock signal.

39. The CAM device of claim 37, wherein the instruction is executed by the CAM device is a single clock cycle of the clock signal.

* * * * *